US011495769B2

(12) United States Patent
Bin et al.

(10) Patent No.: US 11,495,769 B2
(45) Date of Patent: Nov. 8, 2022

(54) INORGANIC LIGHT EMITTING DIODE AND INORGANIC LIGHT EMITTING DEVICE INCLUDING THE SAME

(71) Applicant: LG Display Co., Ltd., Seoul (KR)

(72) Inventors: Jong-Kwan Bin, Paju-si (KR); Na-Yeon Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 189 days.

(21) Appl. No.: 17/077,461

(22) Filed: Oct. 22, 2020

(65) Prior Publication Data
US 2021/0167321 A1 Jun. 3, 2021

(30) Foreign Application Priority Data
Nov. 28, 2019 (KR) .................. 10-2019-0155569

(51) Int. Cl.
*H01L 51/52* (2006.01)
*H01L 51/00* (2006.01)
*H01L 51/50* (2006.01)

(52) U.S. Cl.
CPC ........ *H01L 51/5237* (2013.01); *H01L 51/008* (2013.01); *H01L 51/502* (2013.01)

(58) Field of Classification Search
CPC .................. H01L 51/5237; H01L 51/008
See application file for complete search history.

(56) References Cited

PUBLICATIONS

Qu et al., "Boronic acid functionalized graphene quantum dots as a fluorescent probe for selective and sensitive glucose determination in microdialysate", Chem. Commun., 2013, vol. 49, p. 9830-9832.

*Primary Examiner* — Anthony Ho
(74) *Attorney, Agent, or Firm* — Birch, Stewart, Kolasch & Birch, LLP

(57) ABSTRACT

The present disclosure relates to an inorganic light emitting diode (LED) in which an emitting material layer (EML) includes inorganic luminescent particles and a cyclic boronic acid mixed with the inorganic luminescent particles and an inorganic light emitting device including the inorganic LED. The cyclic boronic acid in the EML allows surface defects on the inorganic luminescent particle to be minimized, and stabilizes the particles. As excitons by recombining holes and electrons in the stabilized luminescent particles become stabilized, the particles show improved exciton generation efficiency. The cyclic boronic acid enables the inorganic LED and the inorganic light emitting device to achieve lower driving voltages and improved luminous efficiency.

20 Claims, 24 Drawing Sheets

INORGANIC LIGHT EMITTING DIODE AND INORGANIC LIGHT EMITTING DEVICE INCLUDING THE SAME

CROSS REFERENCE TO RELATED APPLICATION

This application claims the priority benefit under 35 U.S.C. § 119(a) of the Korean Patent Application No. 10-2019-0155569, filed in the Republic of Korea on Nov. 28, 2019, the entire contents of which are incorporated herein by reference in its entirety into the present application.

BACKGROUND

Technical Field

The present disclosure relates to a light emitting diode, and more specifically, to an inorganic light emitting diode with enhanced stability and luminous efficiency and an inorganic light emitting device including the diode.

Discussion of the Related Art

As electronic and information technologies progress rapidly, a field of displays for processing and displaying a large quantity of information has been developed rapidly. Accordingly, various flat panel display devices have been widely used. Among the flat panel display devices, an organic light emitting diode (OLED) has come into spotlight. Since the OLED can be formed even on a flexible transparent substrate and has relatively lower power consumption, the OLED display device has attracted a lot of attention as a next-generation display device replacing LCD. However, in case of increasing current densities or raising driving voltages in the OLED for improving luminance in OLED display device, the luminous lifetime of the OLED become shorter owing to thermal degradation and deteriorations of organic materials in the OLED.

Recently, a display device using inorganic luminescent particles such as quantum dot (QD) or quantum rod (QR) has been developed. QD or QR is an inorganic luminescent particle that emits light as unstable stated excitons shift from its conduction band to its valance band. QD or QR has large extinction coefficient, high quantum yield among inorganic particles and generates strong fluorescence. Besides, since QD or QR has different luminescence wavelengths as its sizes, it is possible to obtain light within the whole visible light spectra so as to implement various colors by adjusting sizes of QD or QR.

When the inorganic luminescent particles such as QD are produced or are introduced into a light emitting diode, the inorganic luminescent particles are exposed to external environment as organic ligands bound to the surface of the particles are detached or separated from the particles. As the inorganic luminescent particles, which is very vulnerable to external environment such as moisture or oxygen, was exposed to external environments, the luminous efficiency of the particles is deteriorated. As the inorganic luminescent particles in which the organic ligand is detached show poor dispersion property in an organic solvent, the particles are agglomerated. Fluorescent energies are transferred among adjacently distributed inorganic luminescent particles by FRET (Forster Resonance Energy Transfer) phenomenon, the external luminous efficiency of the particles are further decreased.

SUMMARY

Accordingly, embodiments of the present disclosure are directed to an inorganic light emitting diode and an inorganic light emitting device having the diode that substantially obviates one or more of the problems due to the limitations and disadvantages of the related art.

An object of the present disclosure is to provide an inorganic light emitting diode that can improve the stability of an inorganic luminescent particle and an inorganic light emitting device including the diode.

Another object of the present disclosure is to provide an inorganic light emitting diode that reduces its driving voltage and improves its luminous efficiency and an inorganic light emitting device including the diode.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concept, as embodied and broadly described, the present disclosure provides an inorganic light emitting diode that comprises a first electrode; a second electrode facing the first electrode; and an emitting material layer disposed between the first and second electrodes, wherein the emitting material layer comprises an inorganic luminescent particle and a cyclic boronic acid mixed with the inorganic luminescent particle.

As an example, the cyclic boronic acid can comprise a $C_4$-$C_{10}$ alicyclic boronic acid.

The cyclic boronic acid can comprise a $C_6$-$C_{20}$ aromatic boronic acid and a $C_3$-$C_{20}$ hetero aromatic boronic acid.

For example, the cyclic boronic acid is unsubstituted or substituted with a group selected from halogen, a hydroxyl group, a $C_1$-$C_{10}$ alkyl group, a $C_1$-$C_{10}$ alkyl halide group, $C_1$-$C_{10}$ alkoxy group, a carbonyl group, an amino group, a $C_1$-$C_{10}$ alkyl amino group and combination thereof.

The contents of the cyclic boronic acid in the emitting material layer can be from about 1 wt % and about 50 wt %, preferably from about 5 wt % and about 15 wt %.

The inorganic luminescent particle can include at least one of a quantum dot (QD) and a quantum rod (QR).

In another aspect, the present disclosure an inorganic light emitting device that comprises a substrate and the inorganic light emitting diode over the substrate, as described above.

It is to be understood that both the foregoing general description and the following detailed description are examples and are explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION OF THE EMBODIMENTS

Reference will now be made in detail to aspects of the disclosure, examples of which are illustrated in the accompanying drawing.

[Inorganic Light Emitting Device]

Figure 1:
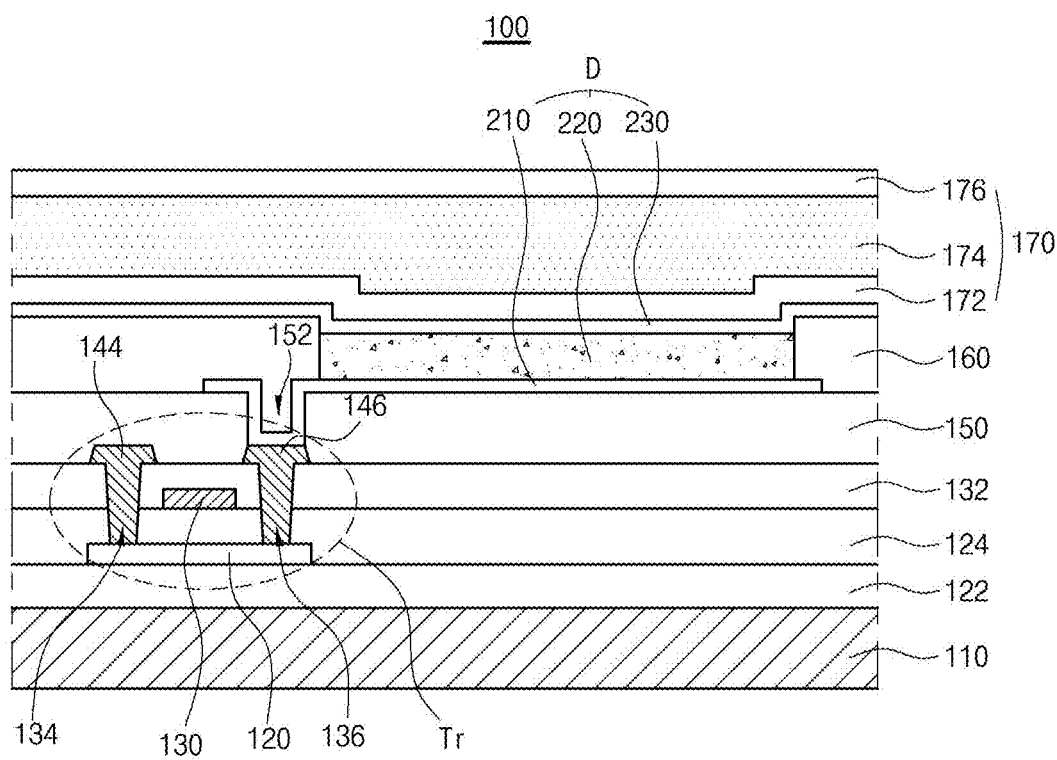
FIG. 1 is a schematic cross-sectional view illustrating an inorganic light emitting display device in accordance with the present disclosure.

The present disclosure relates to an inorganic light emitting diode (LED) in which an EML includes inorganic luminescent particles mixed with cyclic boronic acid so as to improve the stability and exciton generation efficiency of the particles, and thereby reducing the driving voltages and enhancing the luminous efficiency of the inorganic LED, and an inorganic light emitting device including the inorganic LED. The inorganic LED can be applied to an inorganic light emitting device such as an inorganic light emitting display device and an inorganic light emitting illumination device. FIG. 1 is a schematic cross-sectional view illustrating an inorganic light emitting display device in accordance with the present disclosure. All the components of the inorganic light emitting display device according to all embodiments of the present disclosure are operatively coupled and configured.

As illustrated in FIG. 1, an inorganic light emitting display device 100 includes a substrate 110, a thin film transistor Tr over the substrate 110 and an inorganic light emitting diode (LED) D connected to the thin film transistor Tr.

The substrate 112 can include, but is not limited to, glass, thin flexible material and/or polymer plastics. For example, the flexible material can be selected from the group, but is not limited to, polyimide (PI), polyethersulfone (PES), polyethylenenaphthalate (PEN), polyethylene terephthalate (PET), polycarbonate (PC) and combination thereof. The substrate 110, over which the thin film transistor Tr and the inorganic LED D are arranged, form an array substrate.

A buffer layer 122 can be disposed over the substrate 110, and the thin film transistor Tr is disposed over the buffer layer 122. The buffer layer 122 can be omitted.

A semiconductor layer 120 is disposed over the buffer layer 122. In one exemplary aspect, the semiconductor layer 120 can include, but is not limited to, oxide semiconductor materials. In this case, a light-shied pattern can be disposed under the semiconductor layer 120, and the light-shield pattern can prevent light from being incident toward the semiconductor layer 120, and thereby preventing the semiconductor layer 120 from being deteriorated by the light. Alternatively, the semiconductor layer 120 can include polycrystalline silicon. In this case, opposite edges of the semiconductor layer 120 can be doped with impurities.

A gate insulating layer 124 made of an insulating material is disposed on the semiconductor layer 120. The gate insulating layer 124 can include, but is not limited to, an inorganic insulating material such as silicon oxide ($SiO_x$) or silicon nitride ($SiN_x$).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 can be patterned identically as the gate electrode 130.

An interlayer insulating layer 132 made of an insulating material is disposed on the gate electrode 130 with covering over an entire surface of the substrate 110. The interlayer insulating layer 132 can include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over both sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, each of which includes a conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr can have an inverted staggered structure in which a gate electrode is disposed under a semiconductor layer and source and drain electrodes are disposed over the semiconductor layer. In this case, the semiconductor layer can include, but is not limited to, amorphous silicon.

Although not shown in FIG. 1, a gate line and a data line, which cross each other to define a pixel region, and a switching element, which is connected to the gate line and the data line, can be further formed in the pixel region. The switching element is connected to the thin film transistor Tr, which is a driving element. In addition, a power line is spaced apart in parallel from the gate line or the data line, and the thin film transistor Tr can further includes a storage capacitor configured to constantly keep a voltage of the gate electrode for one frame.

Moreover, the inorganic light emitting display device 100 can include a color filter that comprises dyes or pigments for transmitting specific wavelength light of light emitted from the inorganic LED D. For example, the color filter can transmit light of specific wavelength such as red (R), green (G), blue (B) and/or white (W). Each of red, green, and blue color filter can be formed separately in each pixel region. In this case, the inorganic light emitting display device 100 can implement full-color through the color filter.

For example, when the inorganic light emitting display device 100 is a bottom-emission type, the color filter can be disposed on the interlayer insulating layer 132 with corresponding to the inorganic LED D. Alternatively, when the inorganic light emitting display device 100 is a top-emission type, the color filter can be disposed over the inorganic LED D, that is, a second electrode 230.

In addition, the inorganic light emitting display device 100 can further comprise a color conversion layer which transforms specific wavelength light among the light emitted from the inorganic LED D. The color conversion layer can comprise an inorganic luminescent material such as a quantum dot and/or a quantum rod. For example, the color conversion layer can be disposed over the inorganic LED D or under the inorganic LED D.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it can be spaced apart from the second semiconductor layer contact hole 136.

The inorganic LED D includes a first electrode 210 that is disposed on the passivation layer 150 and connected to the drain electrode 146 of the thin film transistor Tr. The inorganic LED D further includes an emissive layer 220 and a second electrode 230 each of which is disposed sequentially on the first electrode 210.

The first electrode 210 is disposed in each pixel region. The first electrode 210 can be an anode and include a conductive material having relatively high work function value. For example, the first electrode 210 can include, but is not limited to, a doped or undoped metal oxide such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd:ZnO), fluorine:tin oxide ($F:SnO_2$), indium:tin oxide ($In:SnO_2$), gallium:tin oxide ($Ga:SnO_2$) or aluminum:zinc oxide (Al:ZnO; AZO). Optionally, the first electrode 210 can include a metal or nonmetal material such as nickel (Ni), platinum (Pt), gold (Au), silver (Ag), iridium (Ir) or a carbon nanotube (CNT), other than the above-described metal oxide.

In one exemplary aspect, when the inorganic light emitting display device 100 is a top-emission type, a reflective electrode or a reflective layer (not shown) can be disposed under the first electrode 210. For example, the reflective electrode or the reflective layer (not shown) can comprise, but is not limited to, aluminum-palladium-copper (APC) alloy.

In addition, a bank layer 160 is disposed on the passivation layer 150 in order to cover edges of the first electrode 210. The bank layer 160 exposes a center of the first electrode 210.

Figure 5:
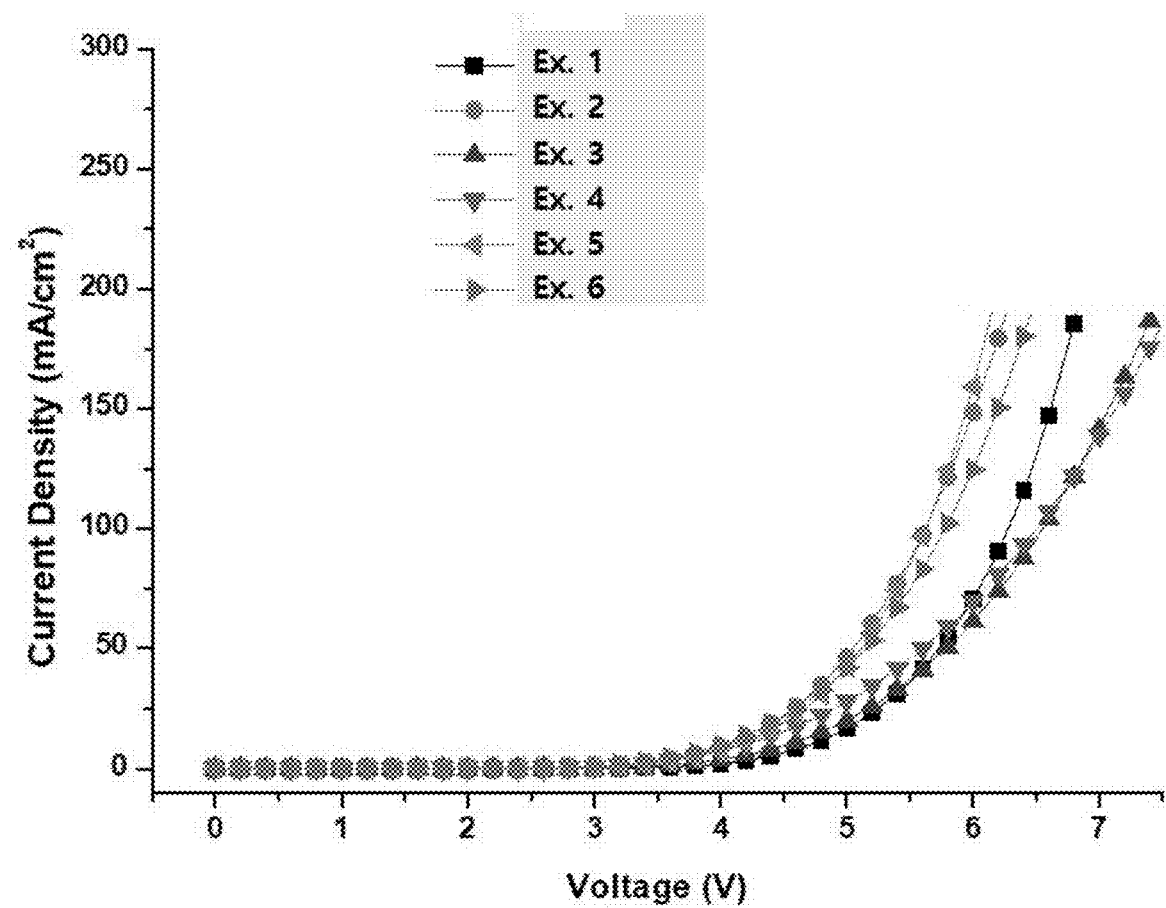
FIG. 5 is a graph illustrating measurement results of voltage (V)—current density in LEDs fabricated in accordance with Examples of the present disclosure.
Figure 6:
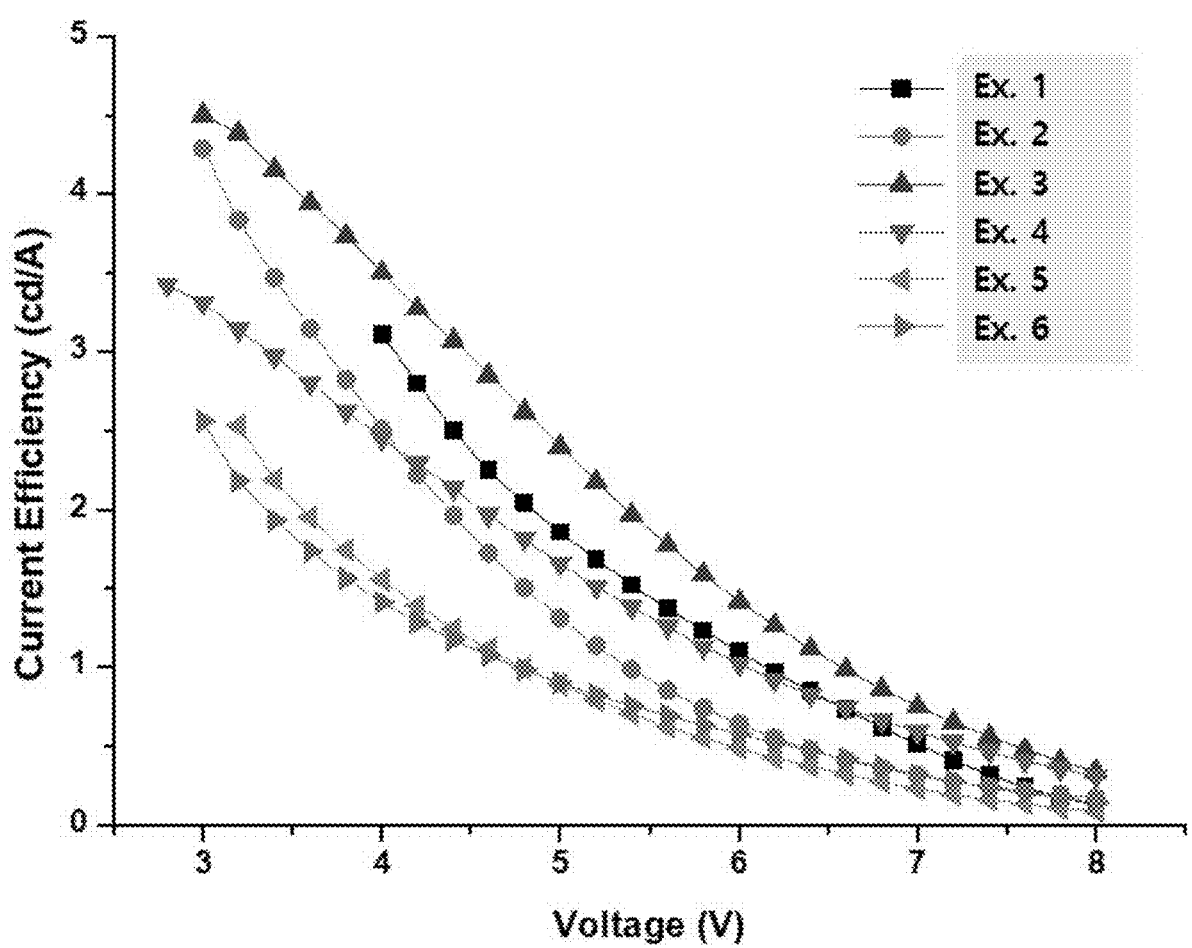
FIG. 6 is a graph illustrating measurement results of voltage (V)—current efficiency (cd/A) in LEDs fabricated in accordance with Examples of the present disclosure.
Figure 7:
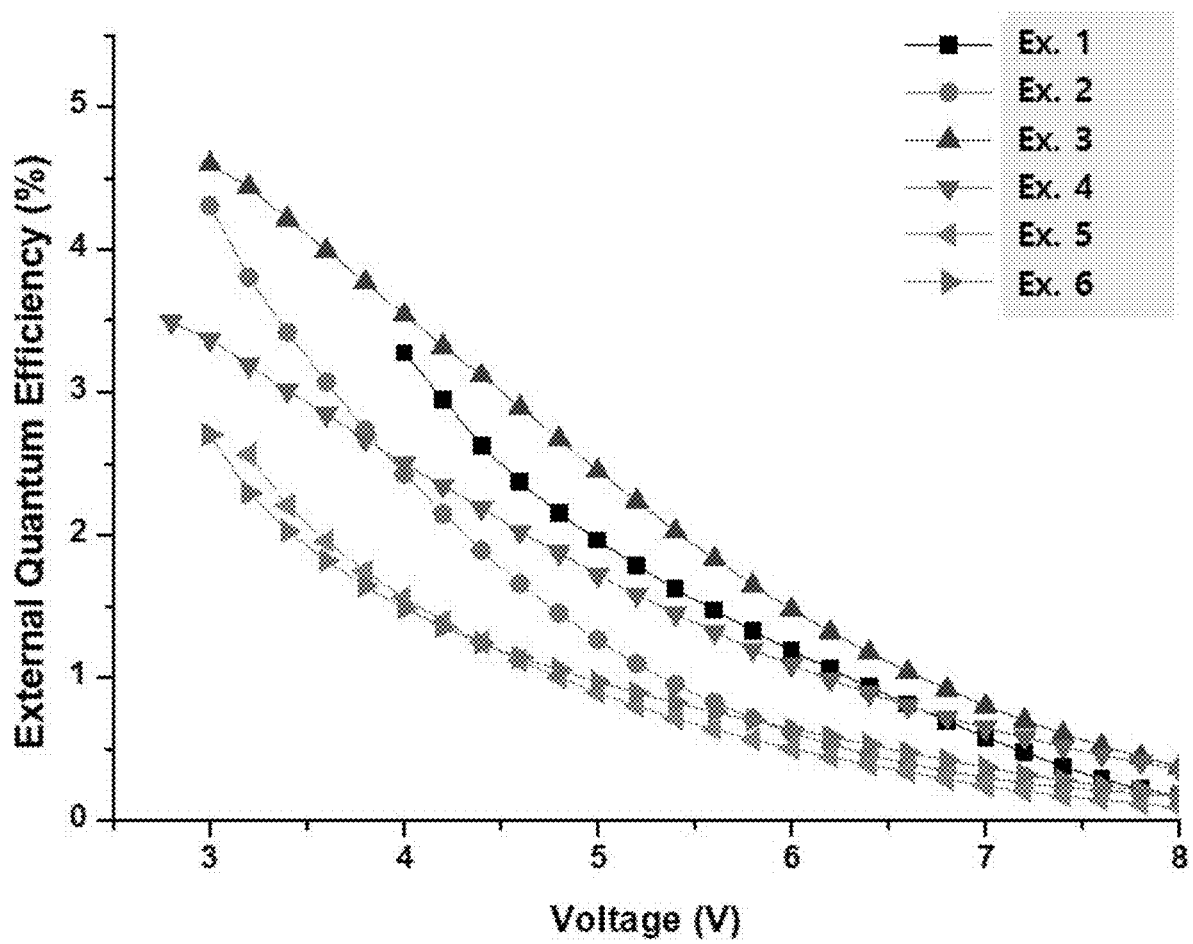
FIG. 7 is a graph illustrating measurement results of voltage (V)—external quantum efficiency (EQE) in LEDs fabricated in accordance with Examples of the present disclosure.
Figure 8A:
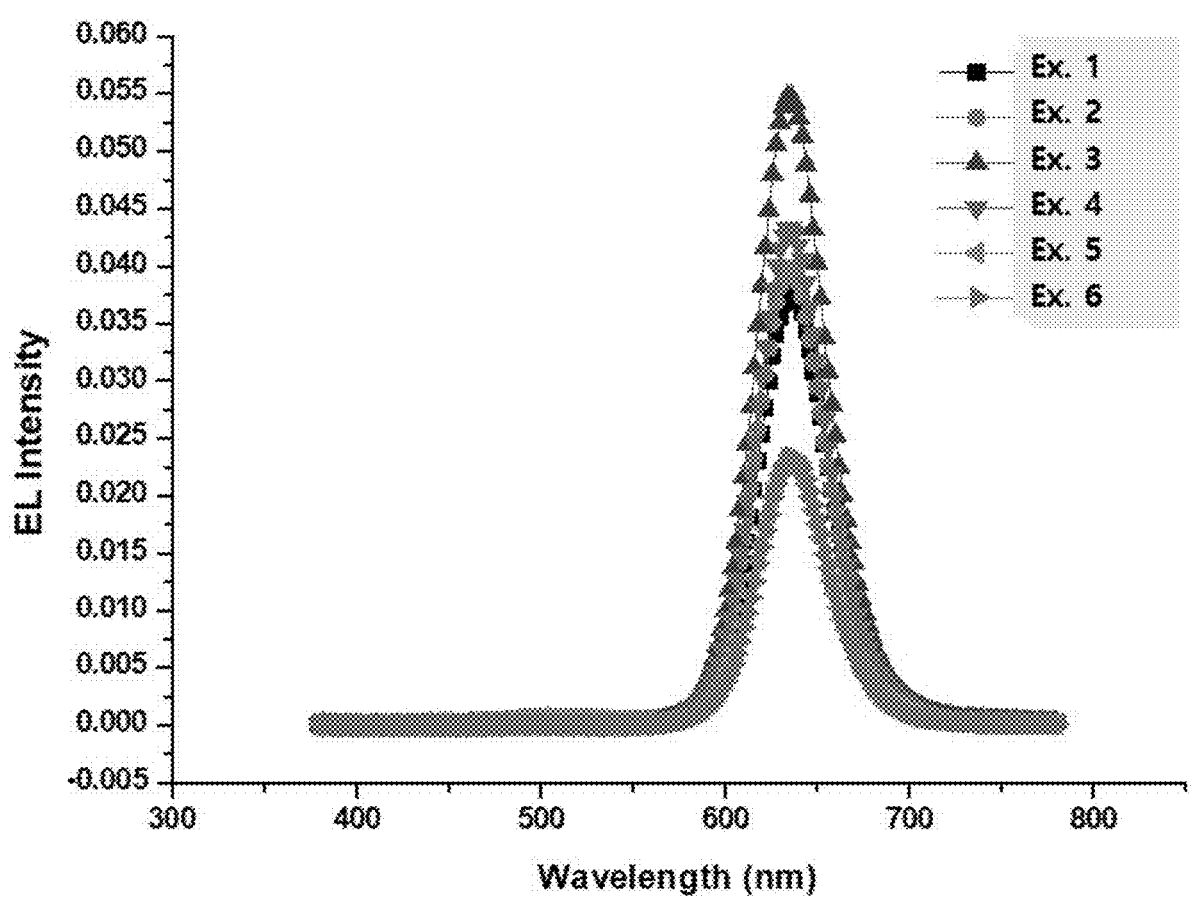
FIGS. 8A to 8G are graphs illustrating measurement results of electroluminescence (EL) intensities in LEDs fabricated in accordance with Examples of the present disclosure.
Figure 8B:
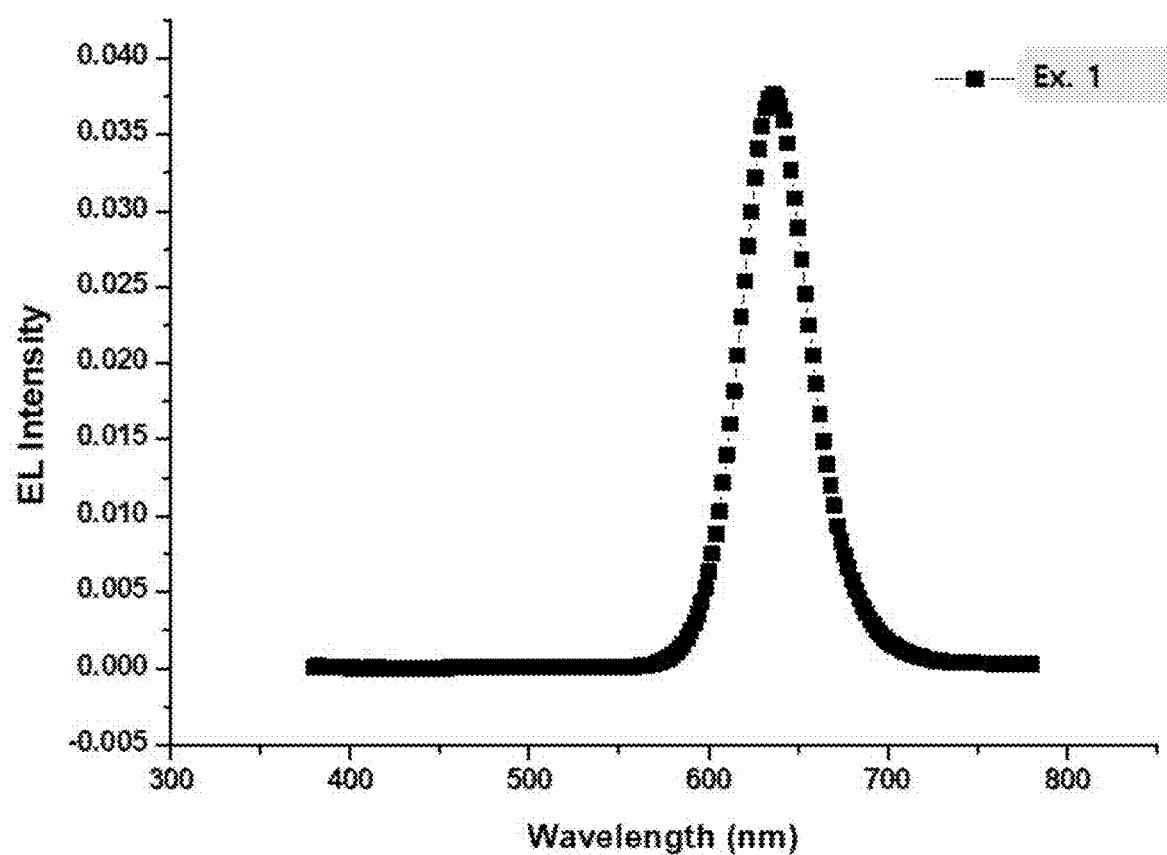
Figure 8C:
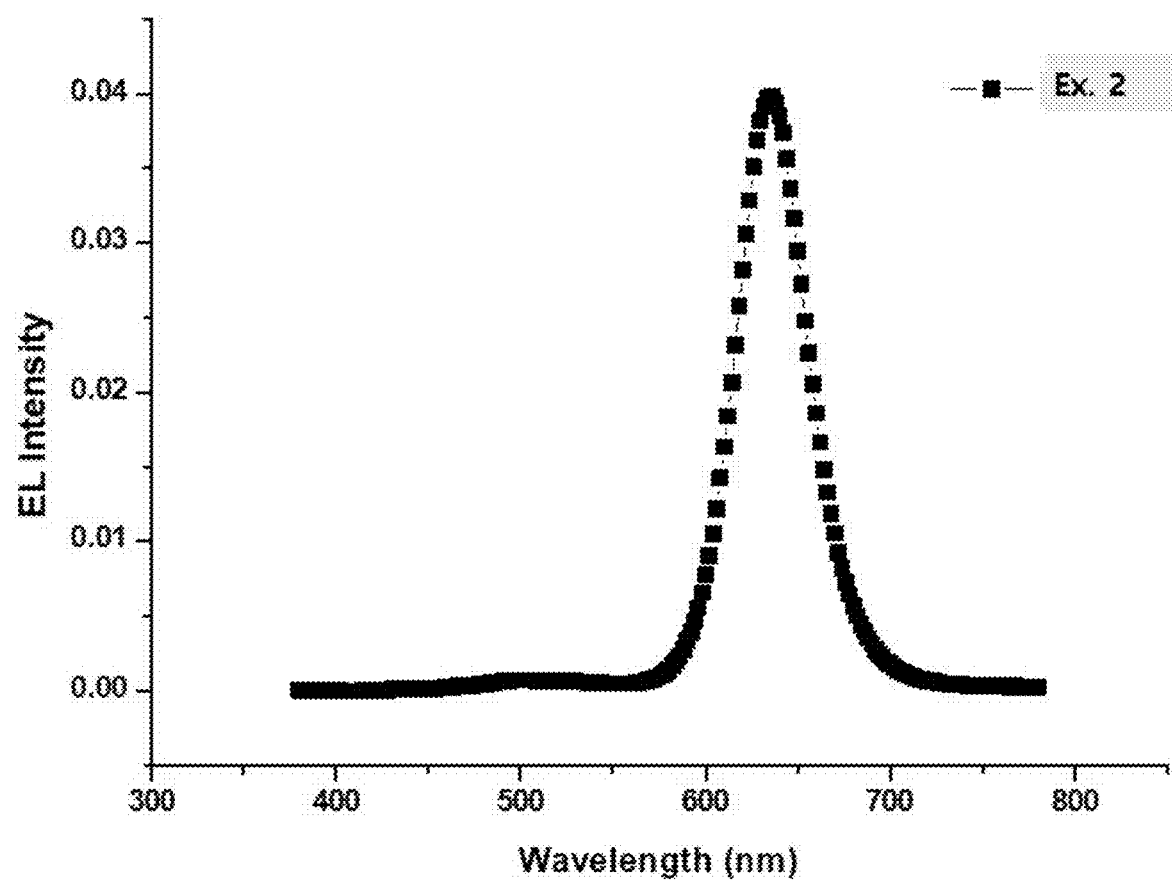
Figure 8D:
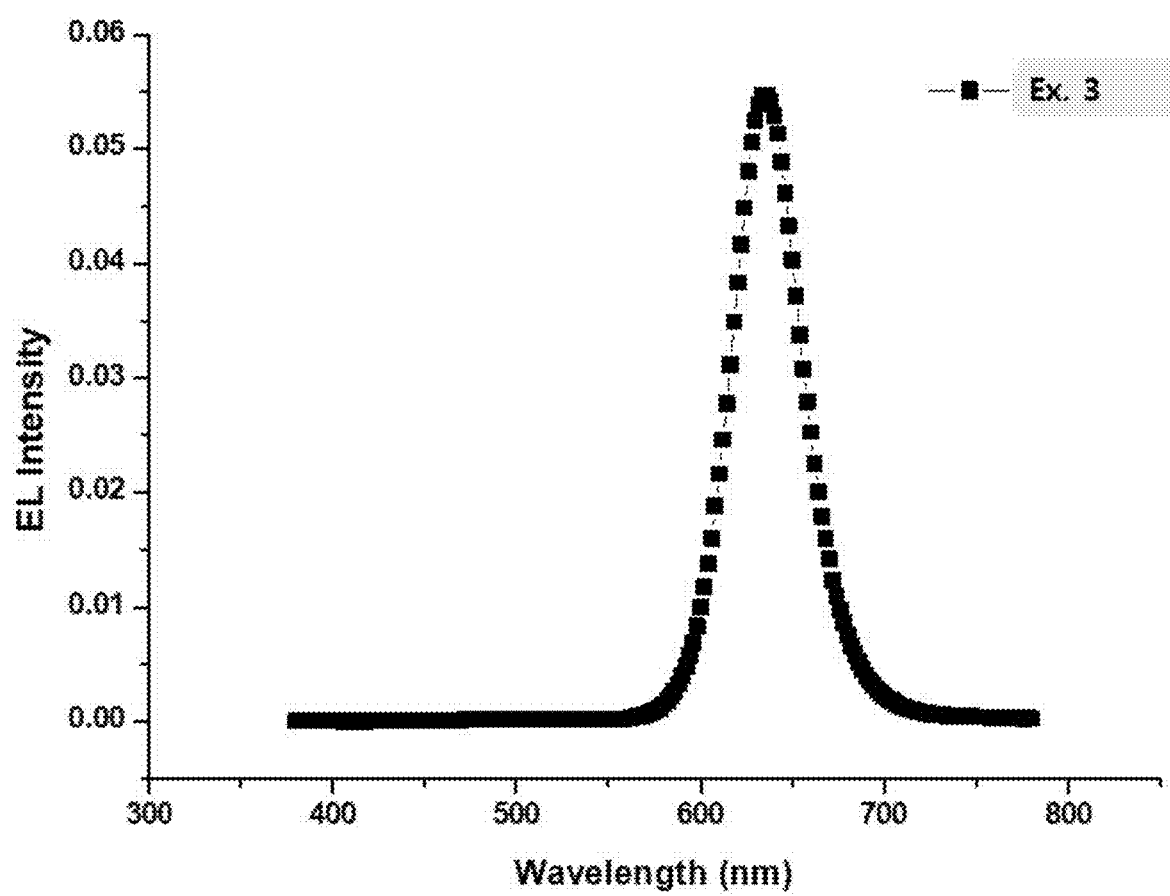
Figure 8E:
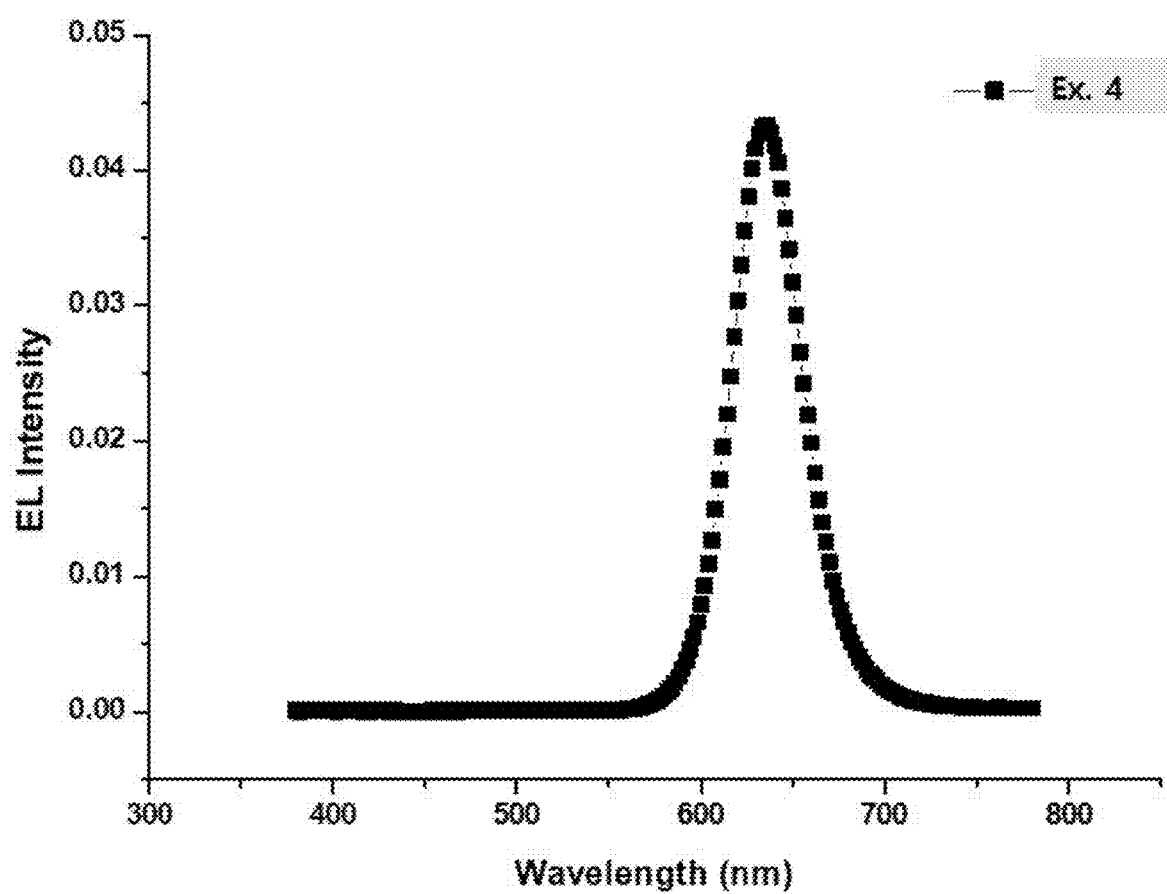
Figure 8F:
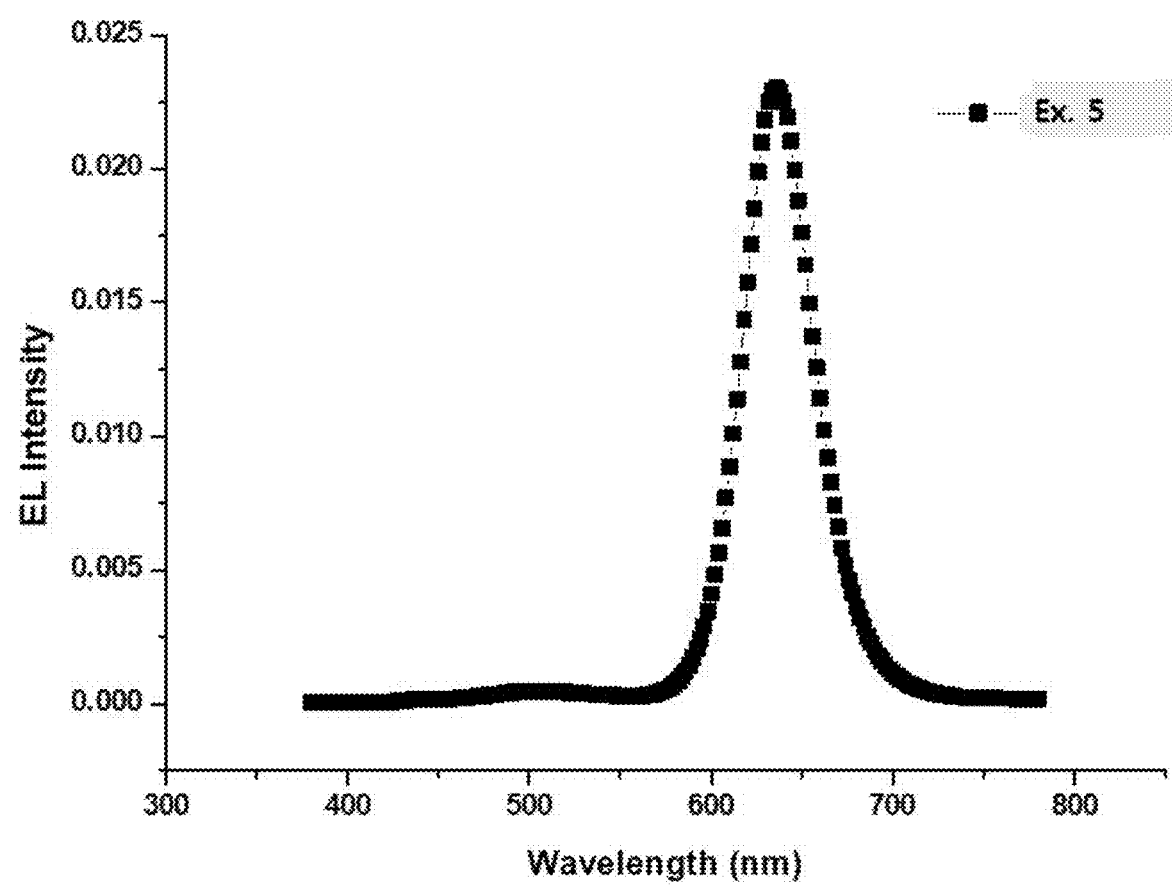
Figure 8G:
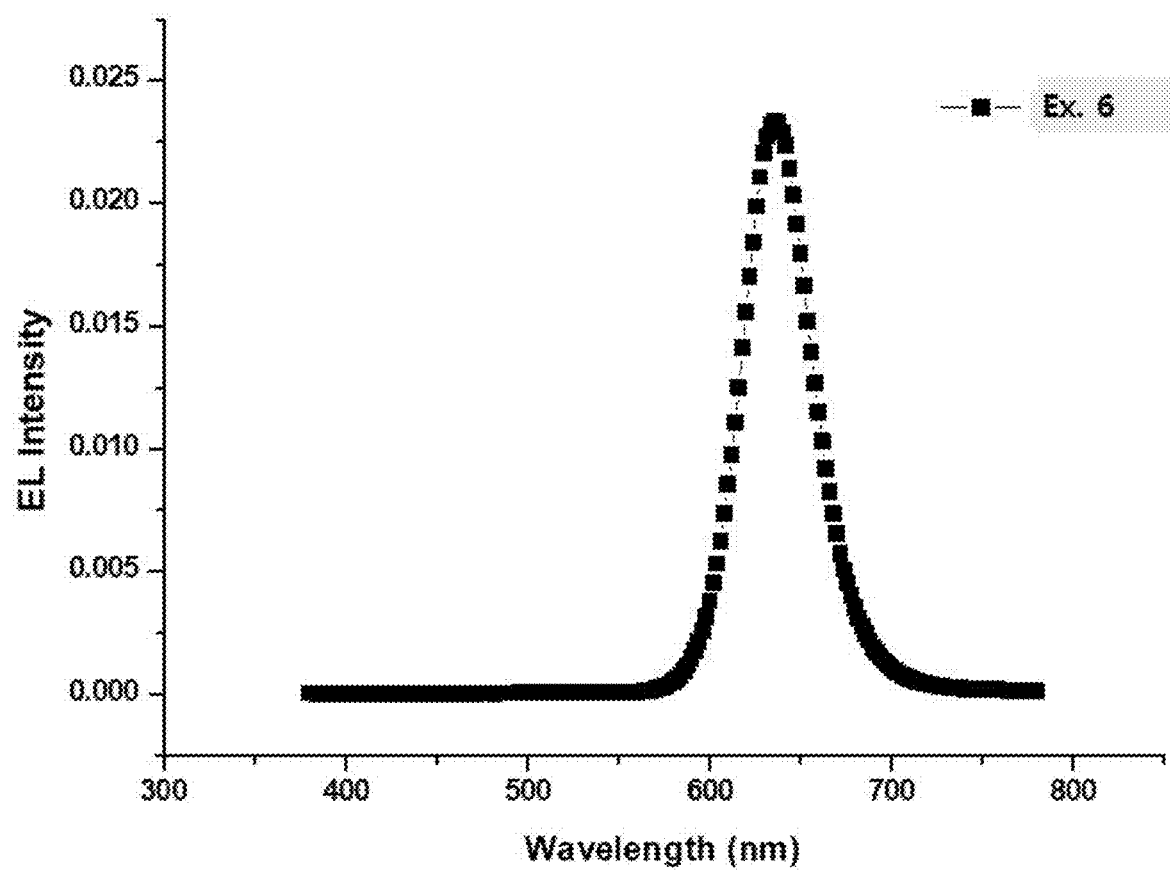
Figure 9A:
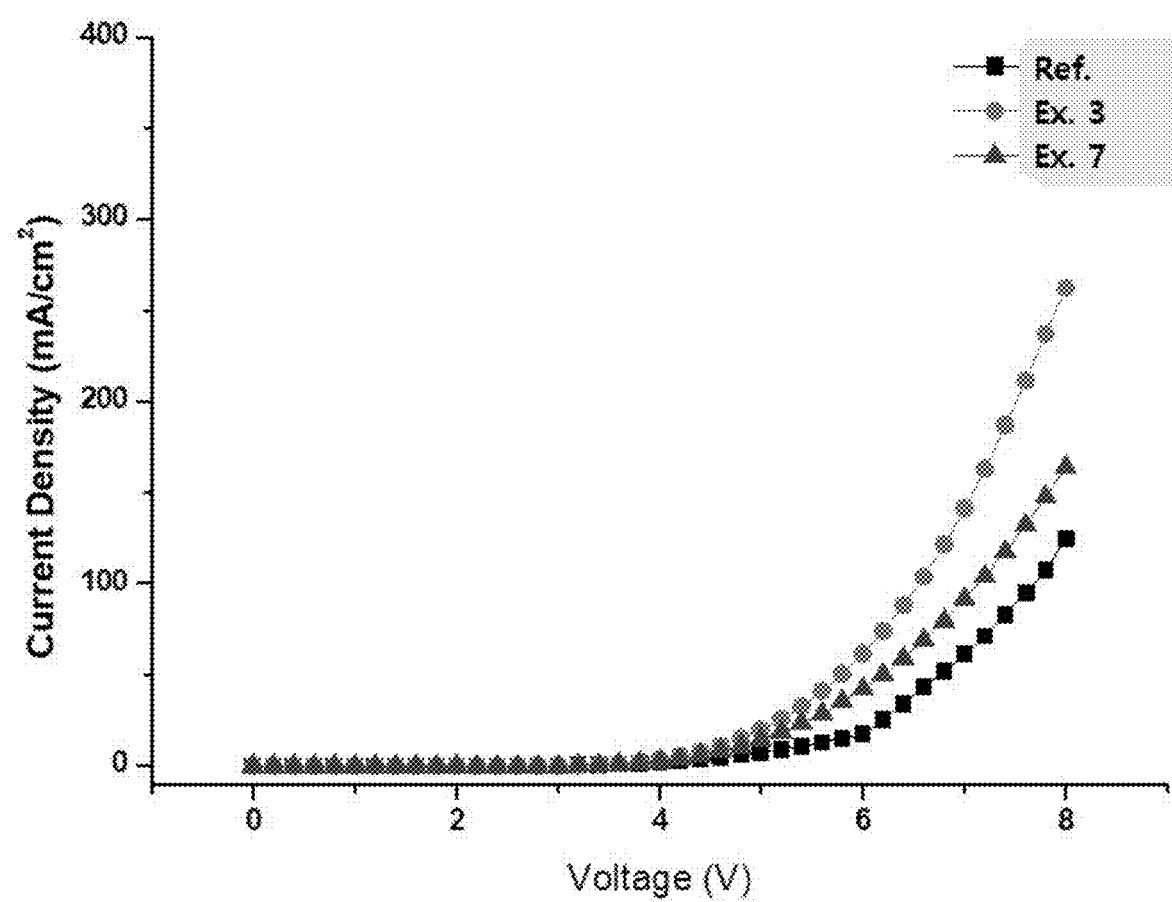
FIGS. 9A to 9C are graphs illustrating measurement results of voltage (V)—current density in LEDs fabricated in accordance with Examples of the present disclosure.
Figure 9B:
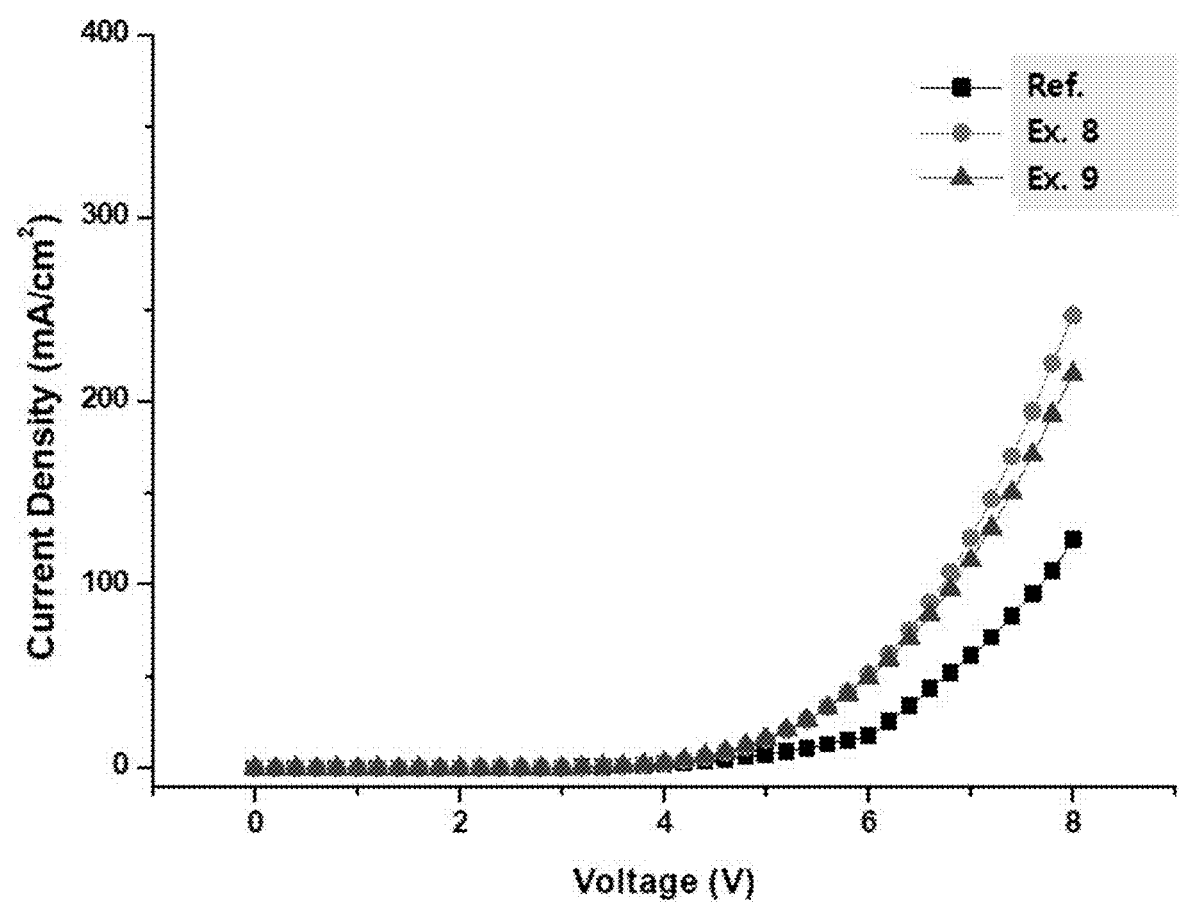
Figure 9C:
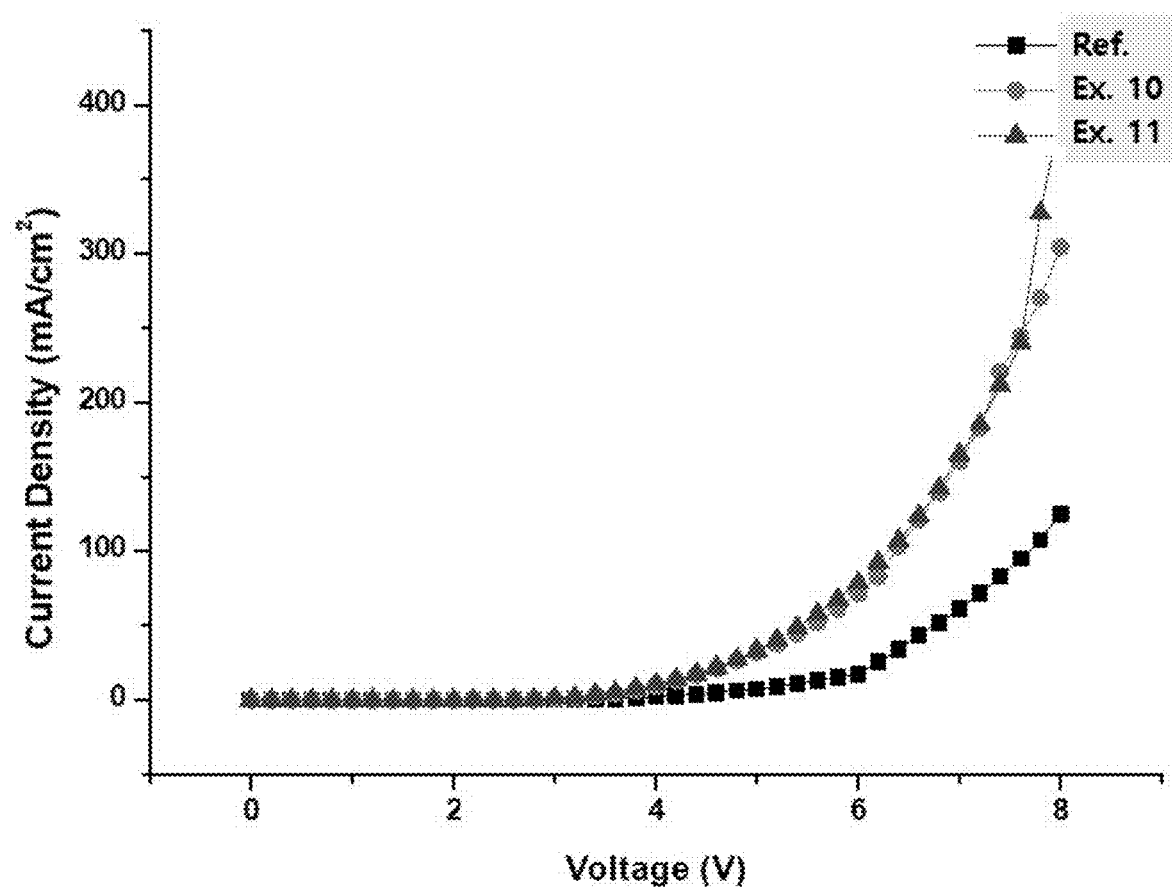
Figure 10A:
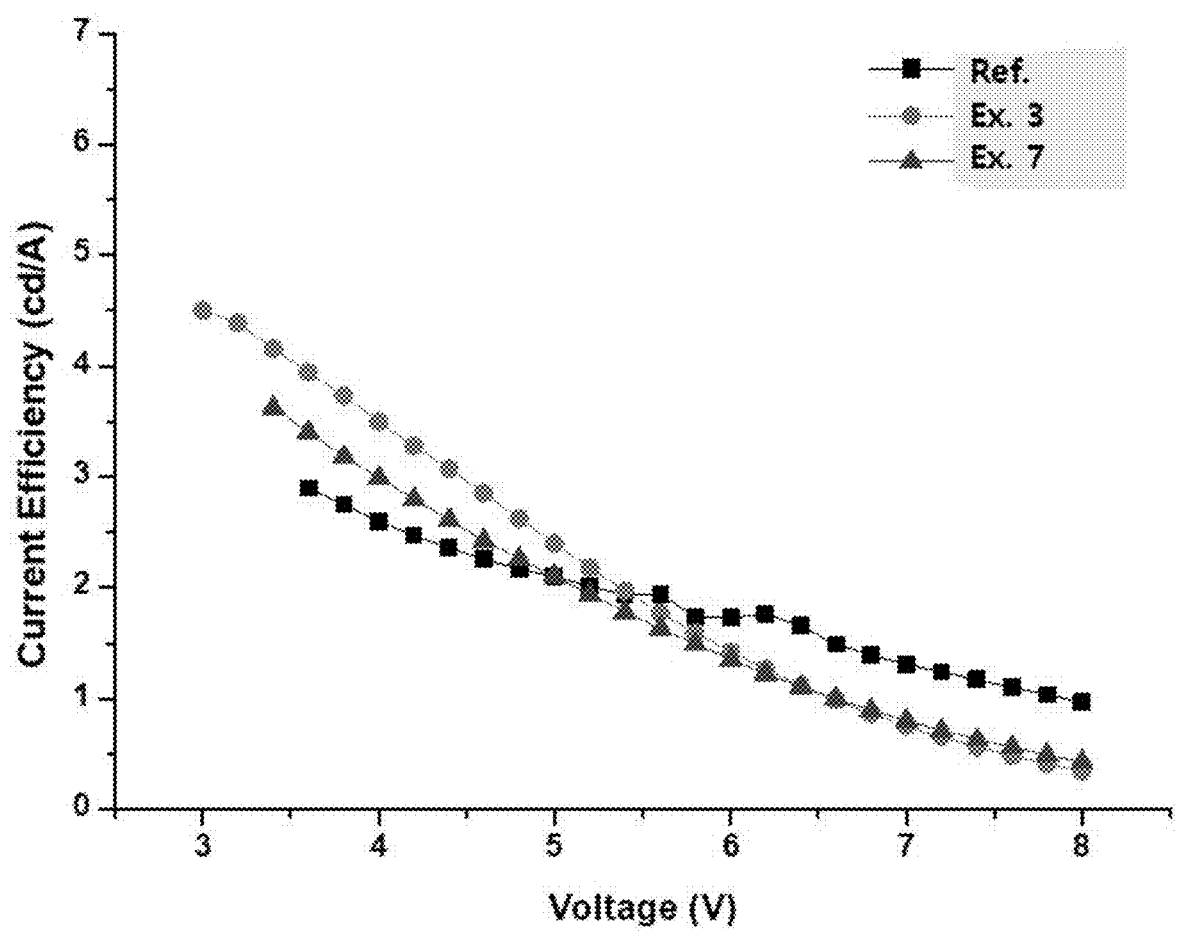
FIGS. 10A to 10C are graph illustrating measurement results of voltage (V)—cd/A in LEDs fabricated in accordance with Examples of the present disclosure.
Figure 10B:
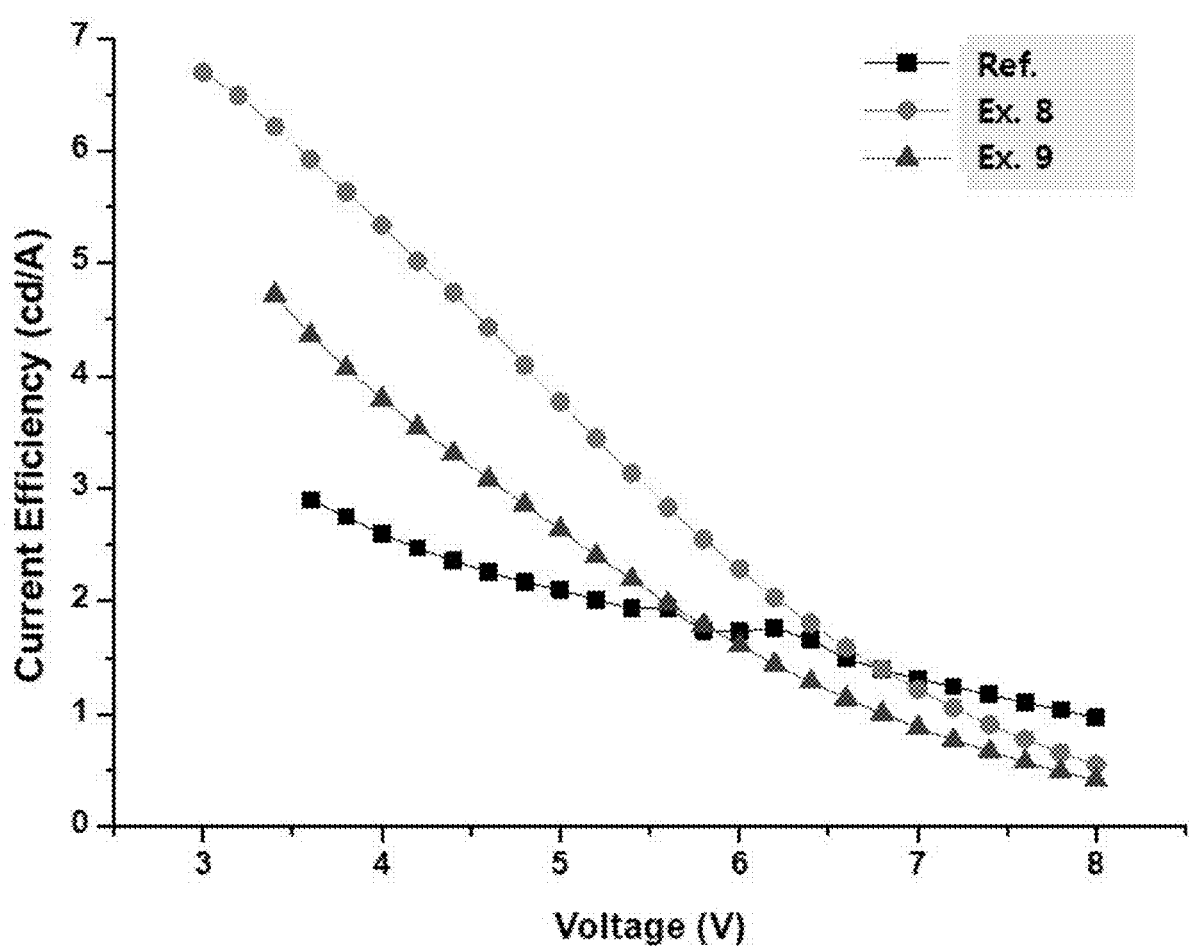
Figure 10C:
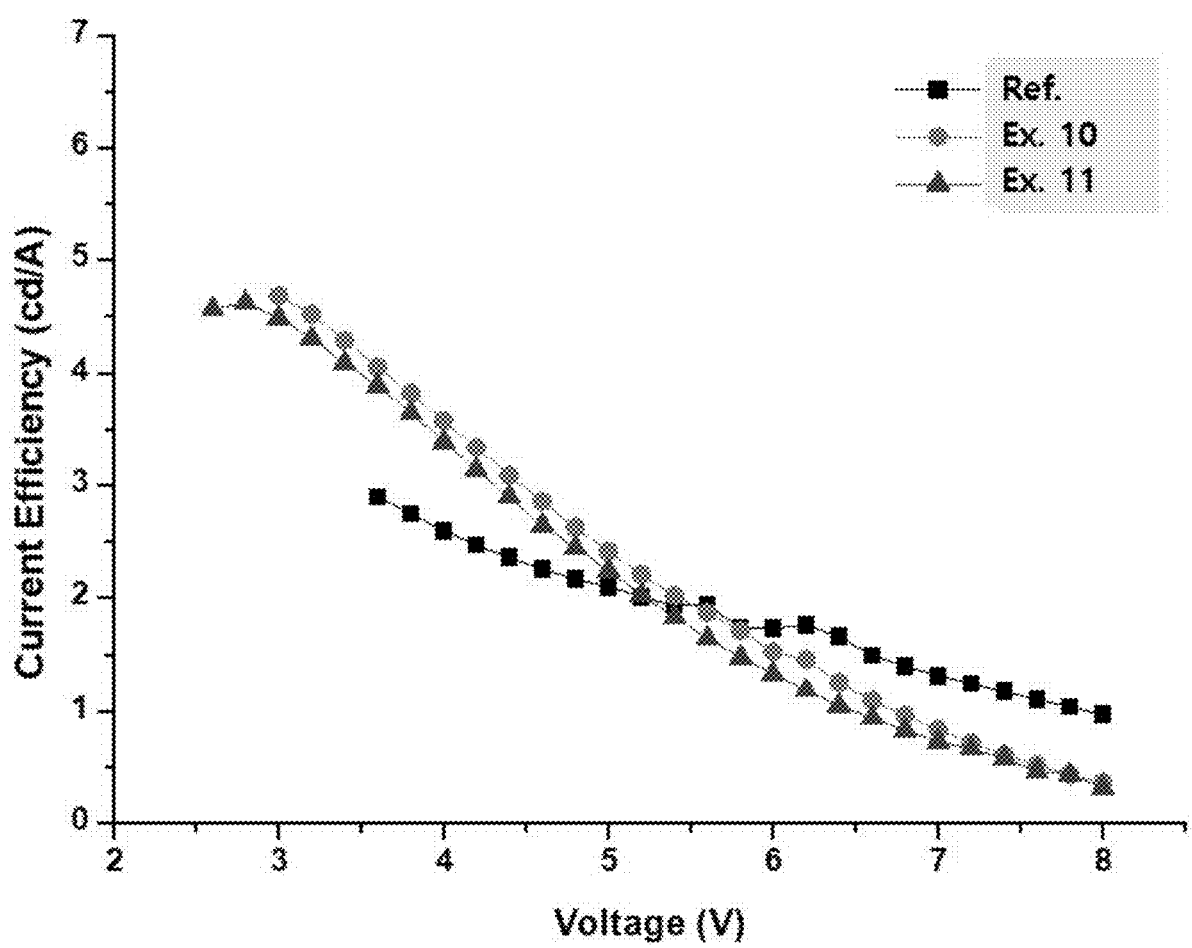
Figure 11A:
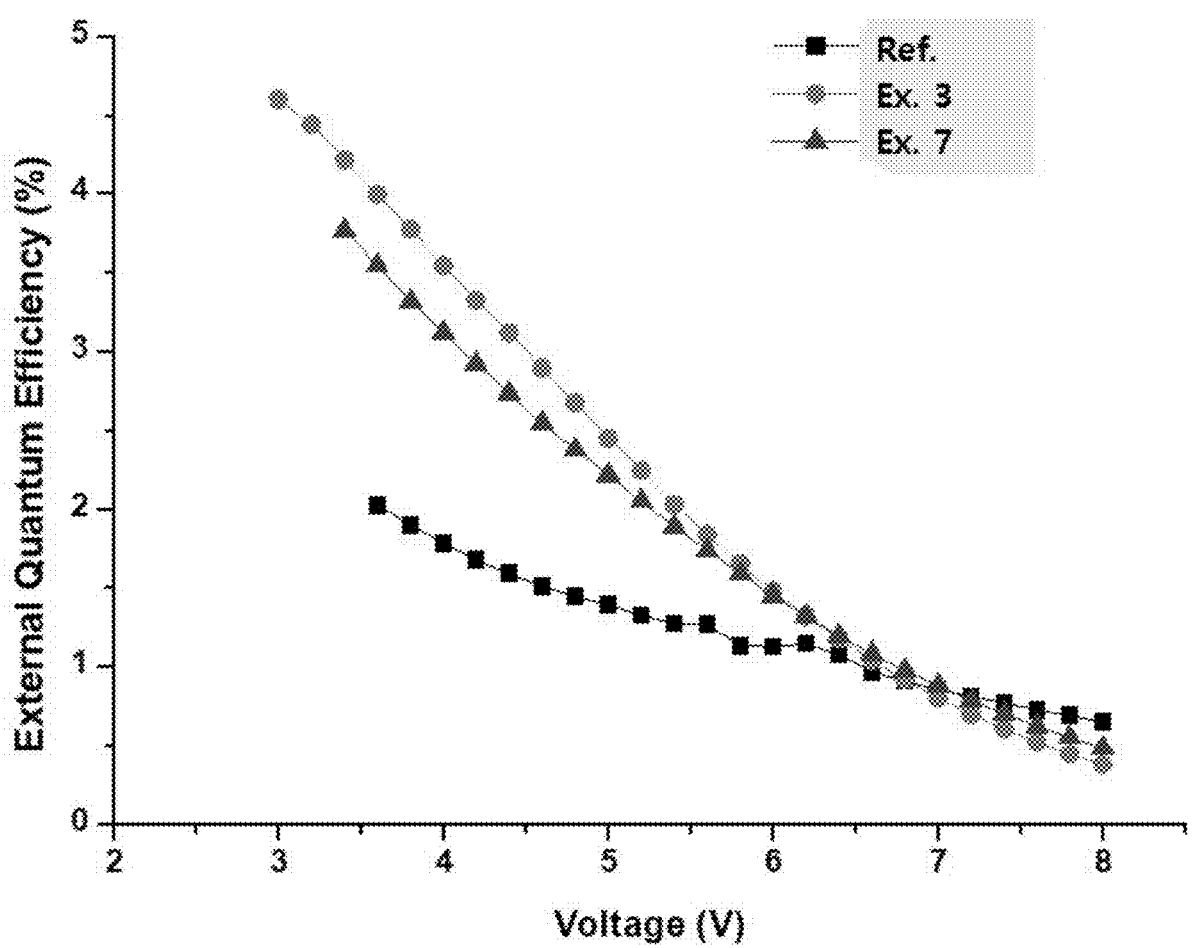
FIGS. 11A to 11C are graph illustrating measurement results of voltage (V)—EQE in LEDs fabricated in accordance with Examples of the present disclosure.
Figure 11B:
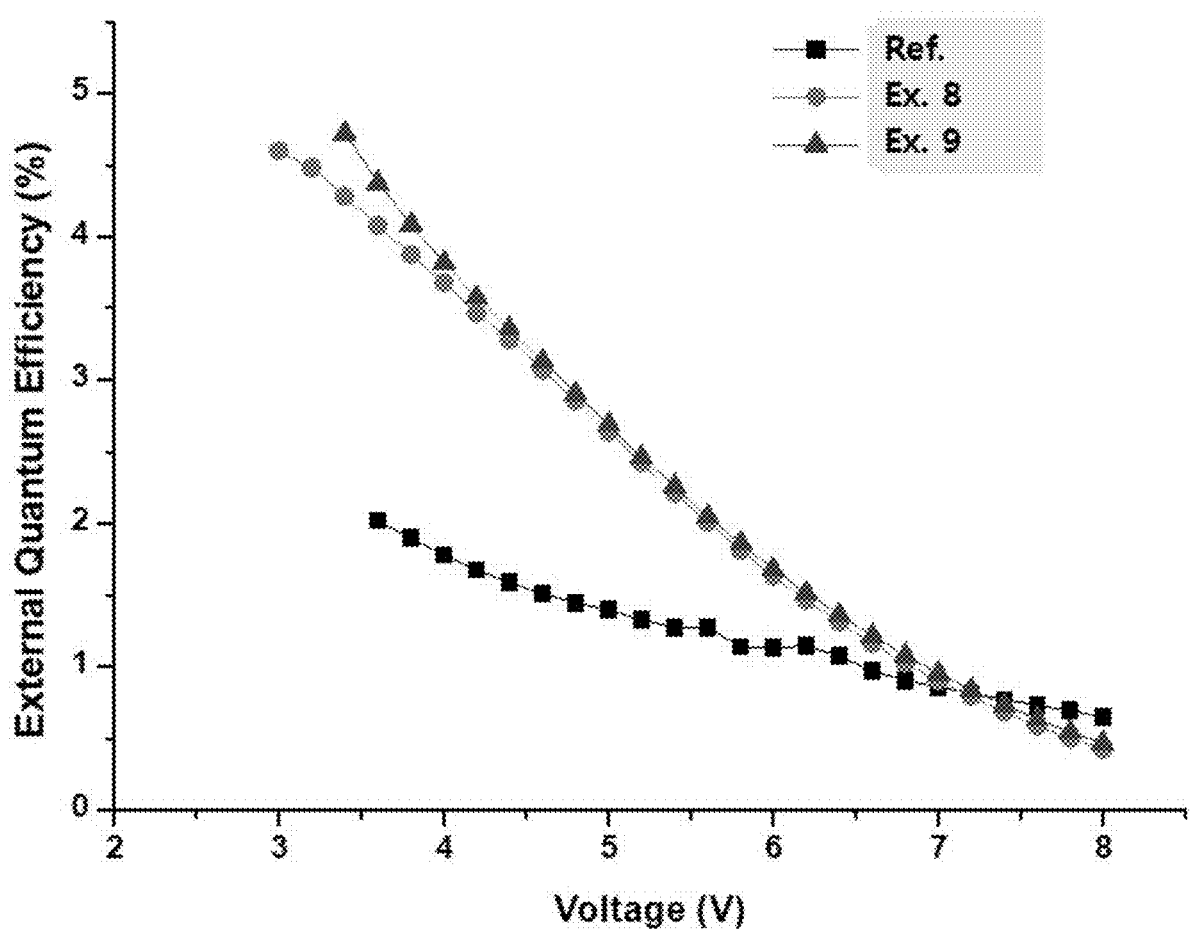
Figure 11C:
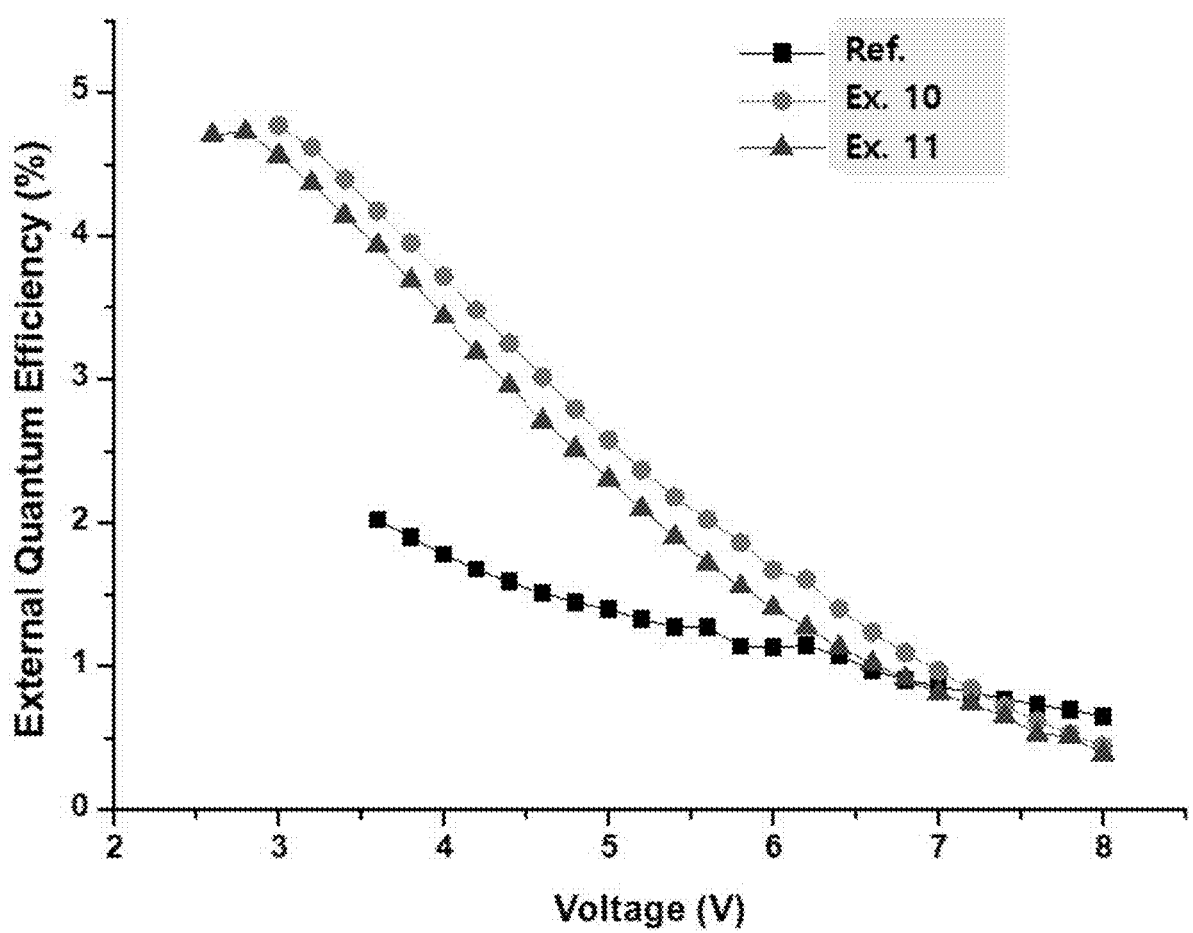
Figure 12A:
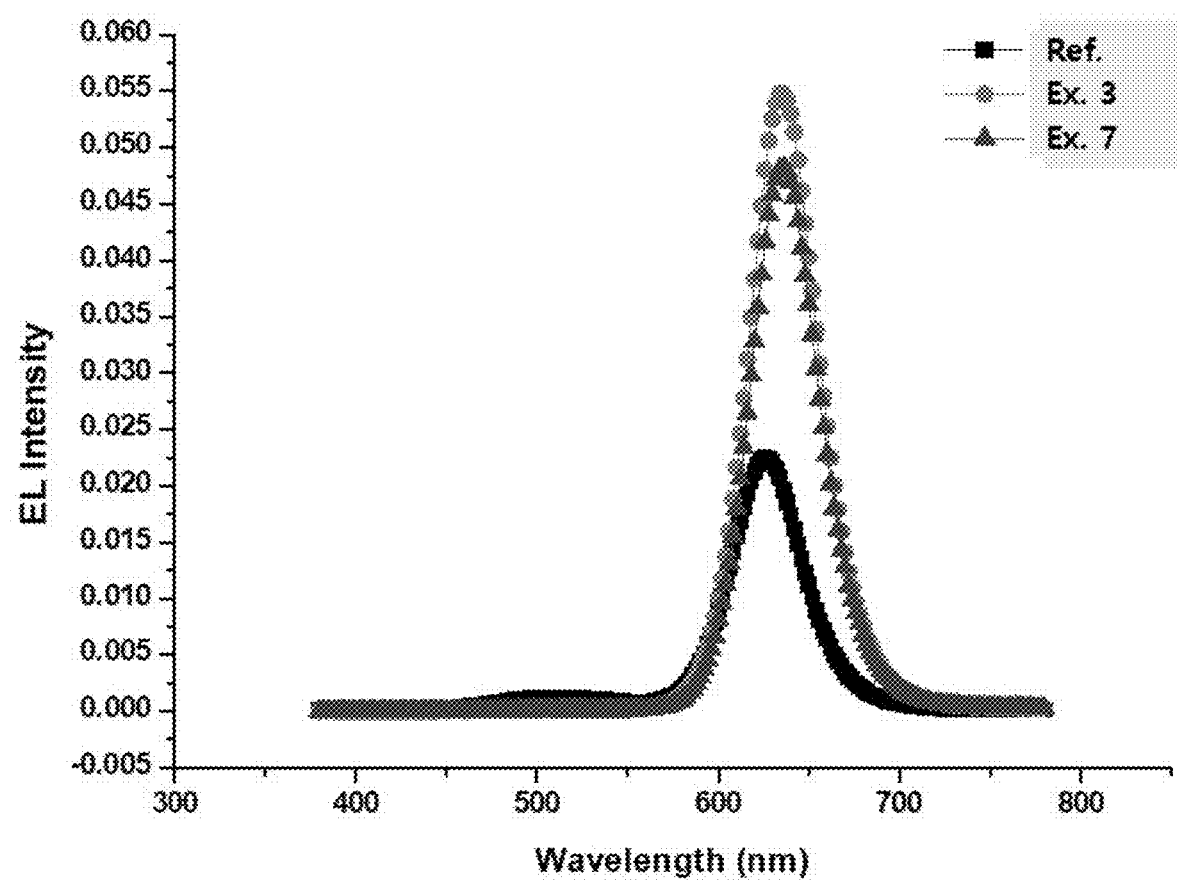
FIGS. 12A to 12C are graphs illustrating measurement results of EL intensities in LEDs fabricated in accordance with Examples of the present disclosure.
Figure 12B:
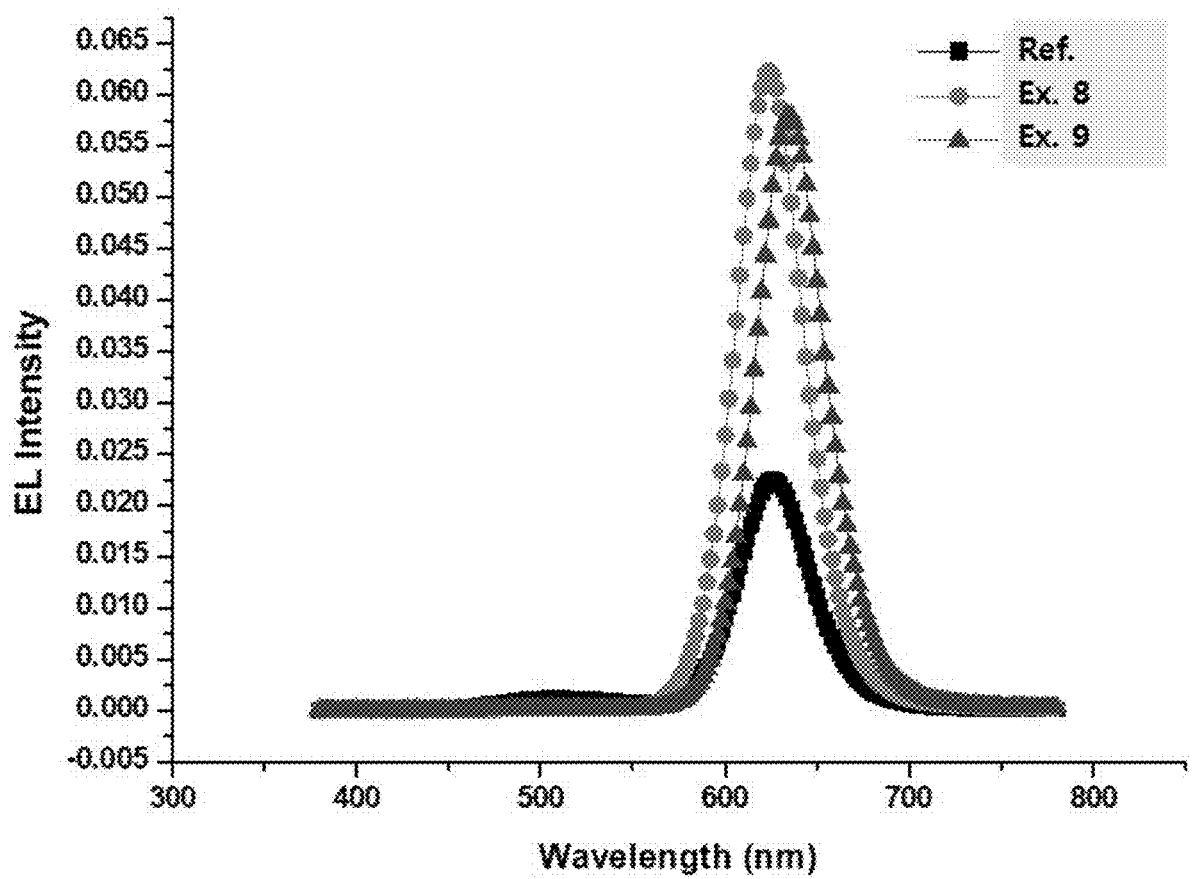
Figure 12C:
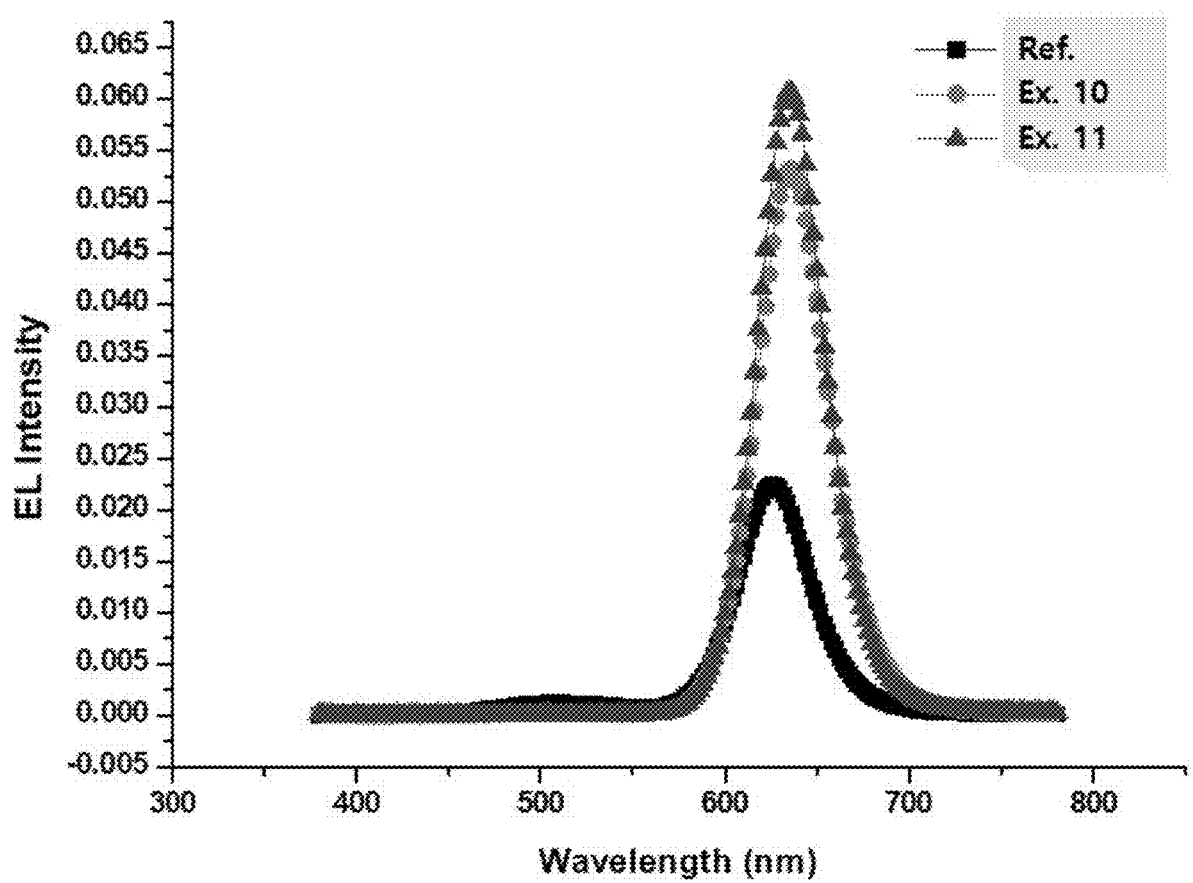

An emissive layer 220 is disposed on the first electrode 210. In one exemplary aspect, the emissive layer 220 can have a mono-layered structure of an emitting material layer (EML) 240 (see, FIG. 2). Alternatively, the emissive layer 220 can have a multiple-layered structure of an EML 240, a first charge transfer layer 250, a second charge transfer layer 270, a CCL 260, and optionally at least one of an electron blocking layer (EBL) 265 and a hole blocking layer (HBL) 275 (see, FIG. 2 or 5). In one exemplary aspect, the emissive layer 220 can have one emitting unit. Alternatively, the emissive layer 220 can have multiple emitting units to form a tandem structure.

The second electrode 230 is disposed over the substrate 110 above which the emissive layer 220 is disposed. The second electrode 230 can be disposed over a whole display area, can include a conductive material having a relatively low work function value compared to the first electrode 210, and can be a cathode. For example, the second electrode 230 can include, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

In addition, an encapsulation film 170 can be disposed over the second electrode 220 in order to prevent outer moisture from penetrating into the inorganic LED D. The encapsulation film 170 can have, but is not limited to, a laminated structure of a first inorganic insulating film 172, an organic insulating film 174 and a second inorganic insulating film 176.

Moreover, a polarizer can be attached to the encapsulation film 170 in order to decrease external light reflection. For example, the polarizer can be a circular polarizer. In addition, a cover window can be attached to the encapsulation film 170 or the polarizer. In this case, the substrate 110 and the cover window can have a flexible property, thus the light emitting display device 100 can be a flexible display device.

[Inorganic Light Emitting Diode]

Figure 2:
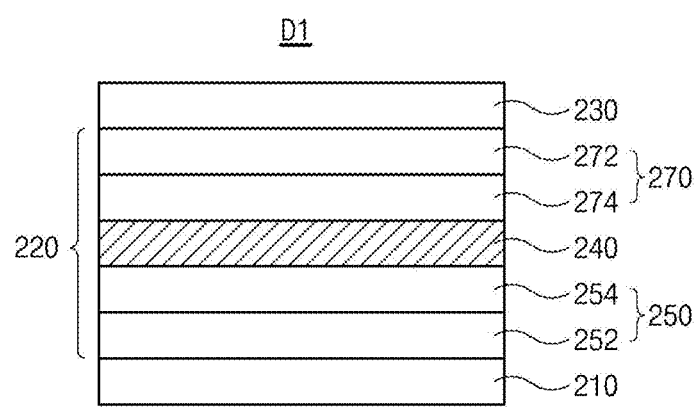
FIG. 2 is a schematic cross-sectional view illustrating an inorganic light emitting diode (LED) in accordance with one exemplary aspect of the present disclosure.

FIG. 2 is a cross-sectional view illustrating an inorganic light emitting diode (LED) in accordance with one exemplary aspect of the present disclosure.

As illustrated in FIG. 2, the inorganic LED D1 comprises a first electrode 210, a second electrode 230 facing the first electrode 210 and an emissive layer 220 disposed between the first and second electrodes 210 and 230. The emissive layer 220 having single emitting unit comprises an EML 240 disposed between the first and second electrodes 210 and 230. Also, the emissive layer 220 includes a first charge transfer layer (CTL1) 250 disposed between the first electrode and the EML 240, a second charge transfer layer (CTL2) 270 disposed between the EML 240.

In this aspect, the first electrode 210 can be an anode such as a hole injection electrode. The first electrode 210 can be located over a substrate 110 (see, FIG. 1) that can be a glass or a polymer. As an example, the first electrode 210 can include, but is not limited to, a doped or undoped metal oxide such as ITO, IZO, ITZO, ICO, $SnO_2$, $In_2O_3$, Cd:ZnO, $F:SnO_2$, $In:SnO_2$, $Ga:SnO_2$ and AZO. Optionally, the first electrode 210 can include a metal or nonmetal material such as Ni, Pt, Au, Ag, Ir and CNT, other than the above-described metal oxide.

The second electrode 230 can be a cathode such as an electron injection electrode. As an example, the second electrode 230 can include, but is not limited to, Ca, Ba, Ca/Al, LiF/Ca, LiF/Al, BaF$_2$/Al, CsF/Al, CaCO$_3$/Al, BaF$_2$/Ca/Al, Al, Mg, Au:Mg or Ag:Mg. As an example, each of the first electrode 210 and the second electrode 230 can have a thickness of, but is not limited to, about 5 to about 300 nm, preferably about 10 nm to about 200 nm.

In one exemplary aspect, when the inorganic LED D1 is a bottom emission-type LED, the first electrode 210 can include, but is not limited to, a transparent conductive metal oxide such as ITO, IZO, ITZO or AZO, and the second electrode 230 can include, but is not limited to, Ca, Ba, Ca/Al, LiF/Ca, LiF/Al, BaF$_2$/Al, Al, Mg, or an Ag:Mg alloy.

The EML 240 can include inorganic luminescent particles 300 (see, FIG. 3) and a cyclic boronic acid 400 (see, FIG. 3) mixed with the inorganic luminescent particles 300. As an example, the inorganic luminescent particles 300 can include quantum dots (QDs) or quantum rods (QRs). QDs or QRs are inorganic luminescent particles each of which emits light as unstable charge excitons shifts from the conduction band energy level to the valance band (VB) energy level. These inorganic luminescent particles 300 have very large extinction coefficient, high quantum yield among inorganic particles and generates strong fluorescence. In addition, these inorganic luminescent particles 300 emit at different luminescence wavelengths as its size, and it is possible to emit lights within the whole visible light spectra so as to implement various colors by adjusting sizes of these inorganic luminescent particles 300. When these inorganic luminescent particles 300 such as QDs and/or QRs are used as a luminescence material in the EML 240, it is possible to enhance color purity in individual pixel region and to realize White (W) light consisting of red (R), green (G) and blue (B) light having high color purity.

In one exemplary aspect, the inorganic luminescent particles 300 (e. g. QDs or QRs) can have a single-layered structure. In another exemplary aspect, the inorganic luminescent particles 300 (e.g. QDs or QRs) can have a multiple-layered heterologous structure, i.e. core 310/shell 320 structures, and can further comprise plural ligands 330 bound to a surface of the shell 320 (see, FIG. 3). Each of the core 310 and the shell 320 can have a single layer or multiple layers, respectively. The reactivity of precursors forming the core 310 and/or shell 320, injection rates of the precursors into a reaction vessel, reaction temperature and kinds of ligands 330 bonded to the outer surface of those inorganic luminescent particles 300 such as QDs or QRs can have affects upon the growth degrees, crystal structures of those inorganic luminescent particles 300. As a result, it is possible to emit lights of various luminescent wavelength ranges, as the energy level bandgap of those inorganic luminescent particles 300 are adjusted.

In one exemplary aspect, the inorganic luminescent particles 300 (e.g. QDs and/or QRs) can have a type I core/shell structure where an energy level bandgap of the core 310 is within an energy level bandgap of the shell 320. In case of using the type I core/shell structure, electrons and holes are transferred to the core 310 and recombined in the core 310. Since the core 310 emits light from exciton energies, it is possible to adjust luminance wavelengths by adjusting sizes of the core 310.

In another exemplary aspect, the inorganic luminescent particles 300 (e.g. QDs and/or QRs) can have type II core/shell structure where the energy level bandgap of the core 310 and the shell 320 are staggered and electrons and holes are transferred to opposite directions among the core 310 and the shell 320. In case of using the type II core/shell structure, it is possible to adjust luminescence wavelengths as the thickness and the energy bandgap locations of the shell 320.

In still another exemplary aspect, the inorganic luminescent particles 300 (e.g. QDs and/or QRs) can have reverse type I core/shell structure where the energy level bandgap of the core 310 is wider than the energy level bandgap of the shell 320. In case of using the reverse type I core/shell structure, it is possible to adjust luminescence wavelengths as thickness of the shell 320.

As an example, when the inorganic luminescent particle 300 (e.g. QDs and/or QRs) has a type-I core/shell structure, the core 310 is a region where luminescence substantially occurs, and a luminescence wavelength of the inorganic luminescent particle 300 is determined as the sizes of the core 310. To achieve a quantum confinement effect, the core 310 necessarily has a smaller size than the exciton Bohr radius according to material of the inorganic luminescent particle 300, and an optical bandgap at a corresponding size.

The shell 320 of the inorganic luminescent particles 300 (e.g. QDs and/or QRs) promotes the quantum confinement effect of the core 310, and determines the stability of the particles 300. Atoms exposed on a surface of colloidal inorganic luminescent particles 300 (e.g. QDs and/or QRs) having only a single structure have lone pair electrons which do not participate in a chemical bond, unlike the internal atoms. Since energy levels of these surface atoms are between the conduction band edge and the valance band edge of the inorganic luminescent particles 300 (e.g. QDs and/or QRs), the charges can be trapped on the surface of the inorganic luminescent particles 300 (e.g. QDs and/or QRs), and thereby resulting in surface defects. Due to a non-radiative recombination process of excitons caused by the surface defects, the luminous efficiency of the inorganic luminescent particles 300 can be degraded, and the trapped charges can react with external oxygen and compounds, leading to a change in the chemical composition of the inorganic luminescent particles 300, or to a permanent loss of the electrical/optical properties of the inorganic luminescent particles 300.

To effectively form the shell on the surface of the core 310, a lattice constant of the material in the shell 320 needs to be similar to that of the material in the core 310. As the surface of the core 310 is enclosed by the shell 320, the oxidation of the core 310 can be prevented, the chemical stability of the inorganic luminescent particles 300 (e.g. QDs and/or QRs) can be enhanced, and the photo-degradation of the core 310 by an external factor such as water or oxygen can be prevented. In addition, the loss of excitons caused by the surface trap on the surface of the core 310 can be minimized, and the energy loss caused by molecular vibration can be prevented, thereby enhancing the quantum efficiency.

In one exemplary aspect, each of the core 310 and the shell 320 can include, but is not limited to, a semiconductor nanocrystal and/or metal oxide nanocrystal having quantum confinement effect. For example, the semiconductor nanocrystal of the core 310 and the shell 320 can be selected from the group, but is not limited to, consisting of Group II-VI compound semiconductor nanocrystal, Group III-V compound semiconductor nanocrystal, Group IV-VI compound semiconductor nanocrystal, Group 1-III-VI compound semiconductor nanocrystal and combination thereof.

Particularly, Group II-VI compound semiconductor nanocrystal of the core 310 and/or the shell 320 can be selected from the group, but is not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof. Group III-V compound semiconductor nanocrystal of the core and/or shell can be selected from the group, but is not limited to, consisting of AlN, AlP, AlAs, AlSb, GaN, GaP, GaAs, GaSb, InN, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and combination thereof.

Group IV-VI compound semiconductor nanocrystal of the core 310 and/or shell 320 can be selected from the group, but is not limited to, consisting of $TiO_2$, $SnO_2$, SnS, $SnS_2$, SnTe, PbO, $PbO_2$, PbS, PbSe, PbTe, PbSnTe and combination thereof. Also, Group I-III-VI compound semiconductor nanocrystal of the core 310 and/or shell 320 can be selected from the group, but is not limited to, $AgGaS_2$, $AgGaSe_2$, $AgGaTe_2$, $AgInS_2$, $CuInS_2$, $CuInSe_2$, $Cu_2SnS_3$, $CuGaS_2$, $CuGaSe_2$ and combination thereof. Alternatively, each of the core 310 and the shell 320 can independently include multiple layers each of which has different Groups compound semiconductor nanocrystal, e.g., Group II-VI compound semiconductor nanocrystal and Group III-V compound semiconductor nanocrystal such as InP/ZnS, InP/ZnSe, GaP/ZnS, and the likes, respectively.

In another aspect, the metal oxide nanocrystal of the core 310 and/or shell 320 can include, but is not limited to, Group II or Group III metal oxide nanocrystal. As an example, the metal oxide nanocrystal of the core 310 and/or the shell 320 can be selected from the group, but is not limited to, MgO, CaO, SrO, BaO, $Al_2O_3$ and combination thereof.

The semiconductor nanocrystal of the core 310 and/or the shell 320 can be doped with a rare earth element such as Eu, Er, Tb, Tm, Dy or an arbitrary combination thereof or can be doped with a metal element such as Mn, Cu, Ag, Al or an arbitrary combination thereof.

As an example, the core 310 in QDs or QRs 300 can include, but is not limited to, ZnSe, ZnTe, CdSe, CdTe, InP, ZnCdS, $CuxIn1-xS$, $CuxIn1-xSe$, $AgxIn1-xS$ and combination thereof. The shell 320 in QDs or QRs 300 can include, but is not limited to, ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, $CdXZn1-xS$ and combination thereof.

In another exemplary aspect, the inorganic luminescent particle 300 can include, but is not limited to, alloy QD or alloy QR such as homogenous alloy QD or QR or gradient alloy QD or QR, e.g. $CdSxSe1-x$, $CdSexTe1-x$, $CdXZn1-xS$, $ZnxCd1-xSe$, $CuxIn1-xS$, $CuxIn1-xSe$, $AgxIn1-xS$.

In another exemplary aspect, the inorganic luminescent particle 300 can be QDs or QRs having a Perovskite structure. The inorganic luminescent particle such as The QDs or QRs of the Perovskite structure comprises a core as a luminescent component and optionally a shell. As an example, the core 310 of the inorganic luminescent particle 300 having the Perovskite structure can have the following structure of Chemical Formula 1:

[ABX₃]                                [Chemical Formula 1]

In Chemical Formula 1, A is an organic ammonium or alkali metal; B is a metal selected from the group consisting of divalent transition metal, rare earth metal, alkaline earth metal, Pb, Sn, Ge, Ga, In, Al, Sb, Bi, Po and combination thereof, and X is halogen selected from the group consisting of Cl, Br, I and combination thereof.

For example, when the A is an organic ammonium, the inorganic luminescent particle 300 constitutes an inorganic-organic hybrid Perovskite structure. The organic ammonium can comprise, but is not limited to, amidinium-based organic ion, $(CH_3NH_3)_n$, $((C_xH_{2x+1})_nNH_3)_2(CH_3NH_3)_n$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$ and/or $(C_nF_{2n+1}NH_3)_2$)(each of n and x is independently an integer equal to or more than 1, respectively). More specifically, the organic ammonium can be methyl ammonium or ethyl ammonium.

In addition, the alkali metal of the A can comprise, but is not limited to, Na, K, Rb, Cs and/or Fr. In this case, the inorganic luminescent particle constitutes an inorganic metal Perovskite structure.

For example, when the core 310 of the inorganic luminescent particle 300 having Perovskite structure is the inorganic-organic hybrid Perovskite structure, the inorganic-organic hybrid Perovskite structure has a layered structure in which an inorganic plane in which a metal cation is located is sandwiched between organic planes in which the organic cations are located. In this case, since the difference between the dielectric constant of the organic and inorganic materials is large, exciton is constrained in the inorganic plane constituting the inorganic-organic hybrid Perovskite lattice structure, and thus has the advantage of emitting light having high color purity. Also, when the core 310 of the inorganic luminescent particle 300 having Perovskite structure has the inorganic-organic hybrid Perovskite structure, it can be advantageous in terms of material stability.

By adjusting the composition ratio of each component, the kind and composition ratio of halogen (X) atom in the core 310 of the inorganic luminescent particle 300 having the Perovskite structure, it is possible to synthesize the core emitting light in various wavelengths. In addition, unlike the cores constituting other QDs or QRs, the inorganic luminescent particle 300 having Perovskite structure has a stable lattice structure, and thus luminous efficiency can be improved.

The organic ligand 330 bound to the surface on the inorganic luminescent particle 300 is not particularly limited. For example, the organic ligand 330 can comprise, but is not limited to, $C_5$-$C_{30}$ saturated or unsaturated aliphatic acids such as lauric acid or oleic acid; $C_5$-$C_{20}$ aliphatic amines such as oleylamine; phosphine oxides; and $C_2$-$C_{20}$ alkyl thiols. As an example, the organic ligand 330 can be aliphatic acids.

When the inorganic luminescent particles 300 (e.g. QDs and/or QRs) are synthesized or the EML 240 is disposed using the inorganic luminescent particles 300, some of the organic ligand 300 bound to the surface on the inorganic luminescent particles 300 are detached or separated from the particles 300, thus the surface of the inorganic luminescent particles 300 are exposed to external environment. As the inorganic luminescent particles 300, which is feasible to external environment such as oxygen or moisture, has surface defects, charges are trapped on the surface the particles 300, which causes the inorganic LED D1 to raise its driving voltage and to deteriorate its luminous efficiency.

In addition, as the surface of the inorganic luminescent particles 300 becomes unstable, the stability of the inorganic luminescent particles 300 can be reduced. As the dispersion property of the inorganic luminescent particles 300 on which some organic ligands 330 are detached from the surface thereof becomes deteriorated, adjacently distributed inorganic luminescent particles 300 can be agglomerated. As the inorganic luminescent particles 300 are agglomerated, FRET (Forster Resonance Energy Transfer) phenomenon can be occurred among the agglomerated adjacent inorganic luminescent particles 300. As a result, some exciton energy of the inorganic luminescent particles 300 is transferred to the adjacent inorganic luminescent particles 300 without emitting externally.

To address such problems and disadvantages, the EML 240 of the present disclosure includes cyclic boronic acids 400 admixed with the inorganic luminescent particles 300. The boronic acids 400 are dispersed between the inorganic luminescent particles 300 with detached some organic ligands 300 so as to protect the surface of the inorganic luminescent particles 300 while an boronic acid 400 molecule forms a hydrogen bond with adjacent boronic acid molecules. As a result, the surface of the inorganic luminescent particles 300 is little exposed to the external environment, and deterioration in the luminous efficiency of the inorganic luminescent particles 300 due to the surface defects of the inorganic luminescent particles 300 can be prevented. In addition, the cyclic boronic acids 400 dispersing among the inorganic luminescent particles 300 and protecting the surface of the inorganic luminescent particles 300 allow the inorganic luminescent particles 300 to improve its dispersion property in organic solvents.

In one exemplary aspect, the cyclic boronic acid 400 can comprise a $C_4$-$C_{10}$ alicyclic boronic acid. Alternatively, the cyclic boronic acid 400 can comprise a $C_6$-$C_{20}$ aromatic boronic acid and a $C_3$-$C_{20}$ hetero aromatic boronic acid. As an example, the cyclic boronic acid, i.e., nuclear carbon atoms can be unsubstituted or substituted with a group selected from halogen, a hydroxyl group, a $C_1$-$C_{10}$ alkyl group, a $C_1$-$C_{10}$ alkyl halide group, $C_1$-$C_{10}$ alkoxy group, a carbonyl group, an amino group, a $C_1$-$C_{10}$ alkyl amino group and combination thereof. In one exemplary aspect, the cyclic boronic acid can be substituted with at least one, for example, one or two halogen atoms.

As an example, the cyclic boronic acid can comprise, but is not limited to, cyclohexyl boronic acid, phenyl boronic acid, 4-methylphenyl boronic acid, 3,5-dimethylphenyl boronic acid, (2,4,5-trimethylpheny) boronic acid, 4-fluorophenyl boronic acid, 4-chlorophenyl boronic acid, 3,5-difluorophenyl boronic acid, (2,5-dichloro-3-fluorophenyl) boronic acid, 4-(boromethyl)phenyl boronic acid, (difluoro-4-hydroxyphenyl) boronic acid, (3-chloro-2-methxyphenyl) boronic acid, (4-chloro-2-(hydroxymetyl)phenyl) boronic acid, 2,5-dimethoxy-4-methyl-phenyl boronic acid, (4-fluoro-5-isopropyl-2-methoxyphenyl) boronic acid, 2-(aminoethyl)phenyl) boronic acid, naphthalene-1-boronic acid, fluoranthene-3-boronic acid, pyrene-1-boronic acid, pyridine-3-boronic acid, 2-chloropyridine-3-boronic acid, 2-chloropyridine-4-boronic acid, 2-methylpyridine-5-boronic acid, 3-fluoropyridine-2-boronic acid, 2-bromopyridine-3-boronic acid, 2-isopropoxypyridine-5-boronic acid, pyrimidine-5-boronic acid, quinoline-3-boronic acid, imidazole-2-boronic acid, 1H-imdazole-5-boronic acid, {imidazo[1,2-a]pyridin-6-yl}boronic acid, 1H-pyrazole-4-boronic acid, N-methylindole-5-boronic acid, benzopyrazine-6-boronic acid, (1H-indazol-4-yl) boronic acid, 5-methyl-1H-indazol-4-yl-4-boronic acid, furan-3-boronic acid, benzofuran-4-boronic acid, dibenzofuran-4-boronic acid, 1-benzothiophen-2yl-boronic acid, (1H-indol-5-yl) boronic acid, thianthrene-1-boronic acid, 7-amino-6-iodobenzothiophene-2-boronic acid, dibenzothiophene-4-boronic acid and combination thereof.

Figure 3:
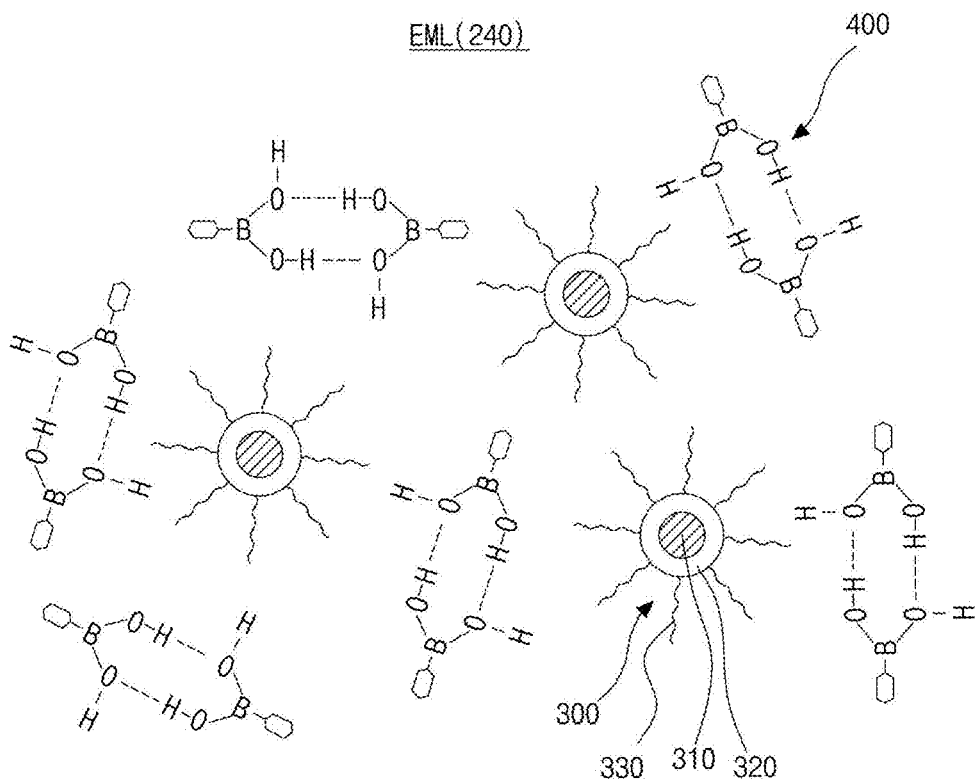
FIG. 3 is a schematic diagram illustrating inorganic luminescent particles mixed with cyclic boronic acids in an EML of the inorganic LED in accordance with the present disclosure.

Now, we will describe advantages by mixing the cyclic boronic acids 400 with the inorganic luminescent particles 300 in the EML 240. FIG. 3 is a schematic diagram illustrating inorganic luminescent particles mixed with cyclic boronic acids in an EML of the inorganic LED D1 in accordance with the present disclosure. As described above, some organic ligands 330 bound to the surface on the inorganic luminescent particles 300 are detached or separated during the synthesis process of the inorganic luminescent particles 300 or the fabrication process of the EML 240, and thereby causing the inorganic luminescent particles 300 to have surface defects.

On the contrary, the EML 240 includes the cyclic boronic acids 400 dispersed among the inorganic luminescent particles 300. The cyclic boronic acid 400 forms the hydrogen bonds with the adjacently distributed other cyclic boronic acids 400 and protects the surface of the inorganic luminescent particles 300. The cyclic boronic acids 400 replace the role of the organic ligands 330 detached from the surface of the inorganic luminescent particles 300, thus the inorganic luminescent particles 300 can be uniformly dispersed in the organic solvent. The cyclic boronic acid 400 is more stably dispersed in the organic solvent compared to a chain-type boronic acid so that it can further improve the surface stability of the inorganic luminescent particles 300.

As the cyclic boronic acid 400 protects the surface of the inorganic luminescent particles 300, the agglomeration among the inorganic luminescent particles 300 can be suppressed. The inorganic luminescent particle 300 is spaced apart from the adjacent inorganic luminescent particles 300 at least a distance corresponding to the molecular length of the cyclic boronic acid 400. By mixing the cyclic boronic acid 400 with the inorganic luminescent particles 300, the FRET phenomenon among adjacent inorganic luminescent particles 300 can be suppressed, and exciton quenching due to the FRET phenomenon can be minimized.

In addition, atoms exposed on the surface of the inorganic luminescent particles 300 that is exposed externally due to some detached organic ligand 330 have lone pair electrons which do not participate in the chemical bond. Energy levels of those exposes surface atoms, which are between the conduction band edge and the valence band edge of the particles 300, allow the charges to be trapped on the surface of the inorganic luminescent particles 300 and the surface defects are occurred. Due to the surface defects, the excitons are quenched without emitting light, so that the luminous efficiency of the inorganic luminescent particles 300 can be reduced. Also, the electrical and optical properties of the inorganic luminescent particles 300 can be lost due to the trapped charges.

On the contrary, the combined cyclic boronic acids 400 stabilizes the surface of the inorganic luminescent particles 300, and thus surface defects such as vacancy that can be formed on the surface of the inorganic luminescent particles 300 can be minimized. Accordingly, when holes and electrons are recombined in the EML 240 to form excitons, the excitons can emit stably light without being trapped on the surface of the inorganic luminescent particles 300. The inorganic LED D1 can lower its driving voltage as well as improve its luminous efficiency by applying the EML 240 in which the cyclic boronic acid 400 is blended to the inorganic luminescent particles 300.

In one exemplary aspect, the contents of the cyclic boronic acid 400 in the EML 240 can be, but is not limited to, from about 1 wt % and about 50 wt %, preferably from about 5 wt % and about 10 wt %, and more preferably from about 10 wt % and about 15 wt %. When the contents of the cyclic boronic acid 400 in the EML 240 is less than about 1 wt %, the dispersion property and/or the stability of the inorganic luminescent particles 400 may not be improved by mixing the cyclic boronic acid 400. Also, when the contents of the cyclic boronic acid 400 in the EML 240 is more than about 50 wt %, the dispersion property of the inorganic luminescent particles 300 becomes deteriorated owing to the excessively added cyclic boronic acid 400, and thus the inorganic LED D1 may not lower its driving voltage and/or improve its luminous efficiency.

When the EML 240 includes inorganic luminescent particles 300 such as QDs and/or QRs and the cyclic boronic acid 400 mixed with the particles 300, the EML 240 can be formed using a solution in which the inorganic luminescent particles 300 and the cyclic boronic acid 400 are dispersed in a solvent, typically a hydrophobic solvent. As an example, the EML 240 can be fabricated by applying the solution in which the inorganic luminescent particles 300 and the cyclic boronic acids 400 are dispersed in the solvent on the CTL1 250 and then by evaporating the solvent. In one exemplary aspect, the EML 240 can be fabricated on the CTL1 250 using any soluble process such as spin coating, drop coating, dip coating, spray coating, roll coating, flow coating casting, screen printing and inkjet printing, or a combination thereof.

In one exemplary aspect, the EML 240 can include inorganic luminescent particles 300 such as QDs and/or QRs having photoluminescence (PL) wavelength peaks of 440 nm, 530 nm, and 620 nm so as to realize white LED. Optionally, the EML 240 can include inorganic luminescent particles 300 such as QDs or QRs having any one of red, green and blue colors, and can be formed to emit any one color. As an example, the EML 240 can have a thickness of, but is not limited to, about 5 nm to about 300 nm, preferably about 10 nm to about 200 nm.

Referring back to FIG. 2, in this aspect, the CTL1 250 can be a hole transfer layer which provides holes with the EML 240. As an example, the CTL 1 250 can include a hole injection layer (HIL) 252 disposed adjacently to the first electrode 210 between the first electrode 210 and the EML 240, and a hole transport layer (HTL) 254 disposed adjacently to the EML 240 between the first electrode 210 and the EML 240.

The HIL 252 facilitates the injection of holes from the first electrode 210 into the EML 240. As an example, the HIL 252 can include, but is not limited to, an organic material selected from the group consisting of poly(ethylenedioxythiophene):polystyrenesulfonate (PEDOT:PSS); 4,4',4"-tris (diphenylamino)triphenylamines (TDATA) doped with tetrafluoro-tetracyano-quinodimethane (F4-TCNQ); p-doped phthalocyanine such as zinc phthalocyanine (ZnPc) doped with F4-TCNQ; N,N'-diphenyl-N,N'-bis(1-naphthyl)-1,1'-biphenyl-4,4"-diamine (α-NPD) doped with F4-TCNQ; hexaazatriphenylene-hexanitrile (HAT-CN); and a combination thereof. As an example, the HIL 252 can include the dopant such as F4-TCNQ in about 1 to about 30% by weight. The HIL 252 can be omitted in compliance with a structure of the inorganic LED D1.

The HTL 254 transports holes from the first electrode 210 into the EML 240. The HTL 254 can include an inorganic material or an organic material. As an example, when the HTL 254 includes an organic material, the HTL 254 can include, but is not limited to, 4,4'-bis(p-carbazolyl)-1,1'-biphenyl compounds such as 4,4'-bis(N-carbazolyl)-1,1'-biphenyl (CBP) and 4,4'-bis(9-carbazolyl)-2,2'-dimethylbiphenyl (CDBP); aromatic amines, i.e. aryl amines or polynuclear aromatic amines selected from the group consisting of α-NPD, N4,N4'-di(naphthalene-1-yl)-N4,N4'-bis (4-vinylphenyl)biphenyl-4,4'-diamine (VNPB), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N, N'-diphenylbenzidine (DNTPD), N,N'-Bis(3-methylphenyl)-N,N'-bis(phenyl)-9,9'-dioctylfluorene (DOFL-TPD), N2,N7-Di(naphthalene-1-yl)-9,9-dioctyl-N2,N7-diphenyl-9H-fluorene-2,7-diamine (DOFL-NPB), N4,N4'-Bis(4-(6-((3-ethyloxetan-3-yl)methoxy)hexyl)phenyl)-N4,N4'-diphenylbiphenyl-4,4'-diamine (OTPD), tris(4-carbazolyl-9-ylphenyl)amine (TCTA), tetra-N-phenylbenzidine (TPB), tris(3-methylphenylphenylamino)-triphenylamine (m-MTDATA), poly(9,9'-dioctylfluorenyl-2,7-diyl)-co-(4,4'-(N-(4-sec-butylphenyl)diphenylamine (TFB), poly(4-butylphenyl-dipnehyl amine) (poly-TPD), spiro-NPB and combination thereof, conductive polymers such as polyaniline, polypyrrole, PEDOT:PSS; PVK and its derivatives; poly(para) phenylene vinylenes (PPV) and its derivatives such as poly[2-methoxy-5-(2-ethylhexyloxy)-1,4-phenylene vinylene] (MEH-PPV), poly[2-methoxy-5-(3',7'-dimethyloctyloxy)-1,4-phenylene vinylene] (MOMO-PPV); polymethacrylate and its derivatives; poly(9,9-octylfluorene) and its derivatives; poly(spiro-fluorene) and its derivatives; polyvinylfluoro and its derivatives such as poly[9-sec-butyl-2,7-difluoro-9H-carbazole] (2,7-F-PVF); metal complexes such as copper phthalocyanine (CuPc); and combination thereof.

In one exemplary aspect, the HTL 254 can have a multi-layered structure of a first HTL (HTL1) disposed between the HIL 252 and the EML 240 and a second HTL (HTL2) disposed between the HTL1 and the EML 240. In this case, the HTL2 can be designed to have HOMO (Highest Occupied Molecular Orbital) energy deeper than HOMO energy level of the HTL1. As an example, the HTL1 can include, but is not limited to, TFB (HOMO: −5.3 eV), poly-TPD (HOMO: −5.1 eV) and/or VNPG (HOMO: −5.58 eV), and the HTL2 can include, but is not limited to, CBP (HOMO: −6.15 eV), PVK (HOML: −5.91 eV) and/or 2,7-F-PVF (HOMO: −6.3 eV).

Alternatively, when the HTL 254 includes an inorganic material, the HTL 254 can comprise an inorganic material selected from the group consisting of a metal oxide nanocrystal, a non-oxide metal nanocrystal and combination thereof. The metal oxide nanocrystal that can be used in the HTL 254 can be oxide nanocrystal of metal selected from Zn, Ti, Ni, Co, Cu, W, Sn, Cr, V, Mo, Mn, Pb, Ce, Re and combination thereof. For example, the metal oxide nanocrystal that can be used in the HTL 254 can be selected from, but is not limited to, the group consisting of ZnO, $TiO_2$, CoO, CuO, $Cu_2O$, FeO, $In_2O_3$, MnO, NiO, PbO, SnOx, $Cr_2O_3$, $V_2O_5$, $Ce_2O_3$, $MoO_3$, $Bi_2O_3$, $ReO_3$ and combination thereof. The non-oxide metal nanocrystal can comprise, but is not limited to, CuSCN, $Mo_2S$ and p-type GAN. Alternatively, the metal oxide and/or the non-oxide metal nanocrystal in the HTL 254 can be doped with a p-dopant. As an example, the p-dopant can be selected from, but is not limited to, $Li^+$, $Na^+$, $K^+$, $Sr^+$, $Ni^{2+}$, $Mn^{2+}$, $Pb^{2+}$, $Cu^+$, $Cu^{2+}$, $Co^{2+}$, $Al^{3+}$, $Eu^{3+}$, $In^{3+}$, $Ce^{3+}$, $Er^{3+}$, $Tb^{3+}$, $Nd^{+3}$, $Y^{3+}$, $Cd^{2+}$, $Sm^{3+}$, N, P, As and combination thereof.

In FIG. 2, while the CTL1 250 is divided into the HIL 252 and the HTL 254, the CTL1 250 can have a mono-layered structure. For example, the CTL1 250 can include only the HTL 254 without the HIL 252 or can include the above-mentioned hole transporting material doped with the hole injection material (e.g. PEDOT:PSS).

The CTL1 250 including the HIL 252 and the HTL 254 can be laminated by any vacuum deposition process such as vacuum vapor deposition and sputtering, or by any soluble process such as spin coating, drop coating, dip coating, spray coating, roll coating, flow coating, casting, screen printing and inkjet printing, or a combination thereof. For example, each of the HIL 252 and the HTL 254 can have a thickness, but is not limited to, from about 10 nm and 200 nm, alternatively, about 10 nm and 100 nm.

The CTL2 270 is disposed between the EML 240 and the second electrode 230. In this aspect, the CTL2 270 can be an electron transfer layer which provides electrons into the EML 240. In one exemplary aspect, the CTL2 270 can include an electron injection layer (EIL) 272 disposed adjacently to the second electrode 230 between the second electrode 230 and the EML 240, and an electron transport layer (ETL) 274 disposed adjacently to the EML 240 between the second electrode 230 and the EML 240.

The EIL 272 facilitates the injection of electrons from the second electrode 230 into the EML 240. For example, the EIL 272 can include, but is not limited to, a metal such as Al, Cd, Cs, Cu, Ga, Ge, In and/or Li, each of which is undoped or doped with fluorine; and/or metal oxide such as $TiO_2$, ZnO, $ZrO_2$, $SnO_2$, $WO_3$ and/or $Ta_2O_3$, each of which is undoped or doped with Al, Mg, In, Li, Ga, Cd, Cs or Cu.

The ETL 274 transfers electrons into the EML 240 and comprises an inorganic material or an organic material. In one exemplary aspect, the ETL 274 can include an inorganic material so as to prevent an interface defect from being formed at an interface between the EML 240 and the ETL 274, and thereby securing driving stability of the inorganic LED D1. In addition, when the ETL 274 includes an inorganic material having high charge mobility, the electron transport rate provided from the second electrode 230 can be improved, and electrons can be transported efficiently into the EML 240 owing to high electron levels or concentrations.

Moreover, in one exemplary aspect, the ETL 274 can include an inorganic material having relatively deep VB (valence band) energy level compared to VB energy level of the inorganic luminescent particles 300 in the EML 240. As an example, an inorganic material having wide energy level bandgap (Eg) between the VB energy level and a CB (conduction band) energy level can be used as an electron transporting material of the ETL 274. In this case, electrons can be efficiently injected into the EML 240 from the second electrode 230 via the ETL 274.

In one exemplary aspect, the ETL 274 can comprise, but is not limited, an inorganic material such as a metal oxide nanocrystal, a semiconductor nanocrystal, a nitride and/or combination thereof. For Example, the ETL 274 can comprise the metal oxide nanocrystal.

As an example, the metal oxide nanocrystal in the ETL 274 can comprise, but is not limited to, an oxide nano particle of a metal component selected from the group consisting of Zn, Ca, Mg, Ti, Sn, W, Ta, Hf, Al, Zr, Ba and combination thereof. More particularly, the metal oxide in the ETL 274 can comprise, but is not limited to, $TiO_2$, ZnO, ZnMgO, ZnCaO, $ZrO_2$, $SnO_2$, SnMgO, $WO_3$, $Ta_2O_3$, $HfO_3$, $Al_2O_3$, $BaTiO_3$, $BaZrO_3$ and combination thereof. The semiconductor nanocrystal in the ETL 274 can comprise, but is not limited to CdS, ZnSe, ZnS, and the like, the nitride in the ETL 274 can comprise, but is not limited to, $Si_3N_4$.

In one exemplary aspect, the ETL 274 can be designed to have the CB (or LUMO) energy level substantially equal to the CB energy level of the EML 240 while the VB energy level deeper than the VB energy level of the EML 240. To this end, the ETL 274 can further include a material (n-dopant) doped to the inorganic nanocrystals. The n-dopant in the ETL 274 can comprise, but is not limited to, cation of metal selected from Al, Mg, In, Li, Ga, Cd, Cs and Cu, particularly trivalent cation.

In an alternative aspect, when the ETL 274 comprises an organic material, the ETL 274 can comprise, but is not limited to, oxazole-based compounds, isoxazole-based compounds, triazole-based compounds, isotriazole-based compounds, oxadiazole-based compounds, thiadiazole-based compounds, phenanthroline-based compounds, perylene-based compounds, benzoxazole-based compounds, benzothiazole-based compounds, benzimidazole-based compounds, triazine-based compounds and aluminum complexes.

More particularly, the organic material in the ETL 274 can comprise, but is not limited to, 3-(4-Biphenyl)-4-phenyl-5-tert-butylphenyl-1,2,4-triazole (TAZ), 2,9-Dimethyl-4,7-diphenyl-1,10-phenaathroline (bathocuproine, BCP), 1,3,5-benzinetriyl)-tris(1-phenyl-1-H-benzimidazole (TPBi), Tris (8-hydroxyquinoline)aluminum ($Alq_3$), bis(2-methyl-8-quninolinato)-4-phenylphenolatealuminum (III) (BAlq), bis (2-methyl-quinolinato)(tripnehylsiloxy) aluminum (III) (Salq) and combination thereof.

Similar to the CTL1 250, while FIG. 2 illustrates the CTL2 270 as a bi-layered structure including the EIL 272 and the ETL 274, the CTL2 270 can have a mono-layered structure having only the ETL 274. Alternatively, the CTL2 270 can have a mono-layered structure of ETL 274 including a blend of the above-described electron-transporting inorganic material with cesium carbonate.

The CTL2 270, which includes the EIL 272 and/or the ETL 274 having the inorganic material, can be fabricated on the EML 240 by any vacuum deposition process such as vacuum vapor deposition and sputtering, or soluble process such as spin coating, drop coating, dip coating, spray coating, roll coating, flow coating, casting, screen printing and inkjet printing, or combination thereof. As an example, each of the EIL 272 and the ETL 274 can have a thickness, but is not limited to, from about 10 nm and about 200 nm, alternatively, about 10 nm and 100 nm.

For example, the inorganic LED D1 can have a hybrid CTL structure in which the HTL 254 of the CTL1 250 includes the organic material as describe above and the CTL2 270, for example, the ETL 274 includes the inorganic material as described above. In this case, The inorganic LED D1 can enhance its luminous properties.

Figure 4:
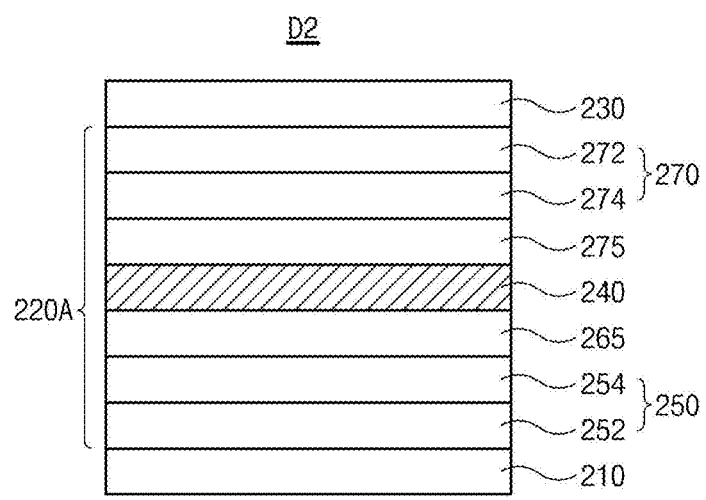
FIG. 4 is a schematic cross-sectional view illustrating an inorganic light emitting diode (LED) in accordance with another exemplary aspect of the present disclosure.

In the first aspect, the emissive layer includes only an EML and charge transfer layers. Unlikely, the inorganic LED of the present disclosure can further comprise at least one exciton blocking layer that controls the charger transfers. FIG. 4 is a schematic cross-sectional view illustrating an inorganic light emitting diode (LED) in accordance with another exemplary aspect of the present disclosure.

As illustrated in FIG. 4, the inorganic LED D2 includes the first electrode 210, the second electrode 230 facing the first electrode 210 and an emissive layer 220A disposed between the first and second electrodes 210 and 230. The emissive layer 220A comprises the EML 340, the CTL1 350 disposed between the first electrode 210 and the EML 240 and the CTL2 270 disposed between the EML 240 and the second electrode 230. In addition, the emissive layer 220A further comprise an EBL 265 as a first exciton blocking layer disposed between the CTL1 250 and the EML 240 and a HBL 275 as a second exciton blocking layer disposed between the EML 240 and the CTL2 270. The configuration of the electrodes 210 and 230 and the emissive layer 220A other than the EBL 265 and HBL 275 can be substantially the same as the corresponding elements in the inorganic LED D1.

The EBL 265 prevents reduction of the luminous lifetime and luminous efficiency of the inorganic LED D2 when electrons are transferred to the first electrode 210 through the EML 240. In other words, the EBL 265 prevents the electron transfer between the HTL 254 and the EML 240. In one exemplary aspect, the EBL 265 can comprises, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, tri-p-tolylamine, 1,1-bis(4-(N,N'-di(ptolyl)amino)phenyl)cyclohexane (TAPC), m-MTDATA, 1,3-bis(N-carbazolyl)benzene (mCP), 3,3'-bis(N-carbazolyl)-1,1'-biphenyl (mCBP), poly-TPD, CuPc, DNTPD and 1,3,5-tris[4-(diphenylamino)phenyl]benzene (TDAPB).

The HBL 275 prevents reduction of the luminous lifetime and luminous efficiency of the inorganic LED D2 when holes are transferred to the second electrode 230 through the EML 240. In other words, the HBL 275 prevents the hole transfer between the ETL 274 and the EML 240. In one exemplary aspect, the HBL 275 can comprise, but is not limited to, oxadiazole-based compounds, triazole-based compounds, phenanthroline-based compounds, benzoxazole-based compounds, benzothiazole-based compounds, benzimidazole-based compounds, triazine-based compounds and aluminum complexes. For example, the HBL 275 can comprise a compound having a relatively low HOMO energy level compared to the luminescent materials in EML 240. The HBL 275 can comprise, but is not limited to, BCP, BAlq, $Alq_3$, 2-biphenyl-4-yl-5-(4-t-butylphenyl)-1,3,4-oxadiazole (PBD), PBD, spiro-PBD and Liq.

The EML 240 in the emissive layer 220A also comprises the inorganic luminescent particles 300 and the cyclic boronic acids 400 mixed with the particles 300. The cyclic boronic acids 400 allow the inorganic luminescent particles 300 to have improved dispersion property so as to prevent the particles 300 from being agglomerated. Also, the cyclic boronic acids 400 minimize the surface defects of the inorganic luminescent particles 300 and stabilize the surface stability of the inorganic luminescent particles 300, and therefore stabilize the excitons formed by recombining holes and electrons in the EML 240. As a result, the inorganic LED D2 can lower its driving voltage and power consumption and improve its luminous efficiency and luminous lifetime.

Example 1 (Ex. 1): Fabrication of QLED

A quantum light emitting diode (QLED) in which cyclohexyl boronic acid (CHB) as a cyclic boronic acid was mixed with quantum dots was fabricated. An ITO (50 nm)-glass was patterned to have luminous area 3 mm×3 mm and washed. And an emissive layer and cathode were laminated as the following order:

A HIL (PEDOT:PSS, spin coating (5000 rpm) in water base, and heating (150° C., 30 minutes), 20-40 nm); a HTL (TFB (9 mg/ML in toluene), spin coating (4000 rpm) and heating (170° C., 30 minutes), 10-30 nm); an EML (red QD InP/ZnSe/ZnS having oleic acid ligand: CHB=99:1 by weight ratio (10 mg/mL in hexane), spin coating (2000 rpm), and heating (80° C., 1 hour), 10-30 nm); an ETL (TPBi, deposited under 10-6 torr of base pressure in a deposition chamber, 30 nm); and a cathode (LiF/Al, deposited in a metal chamber, 80 nm).

After a capping layer (CPL) was deposited on the cathode, the QLED was encapsulated with glass. And then, the QLED was transferred to a dry box for film formation, followed by encapsulation using UV-curable epoxy and moisture getter.

Examples 2-6 (Ex. 2-6): Fabrication of QLED

A QLED was fabricated using the same materials as Example 1, except modifying the concentration of CHB in the EML to 5 wt % (Ex. 2), 10 wt % (Ex. 3), 15 wt % (Ex. 4), 20 wt % (Ex. 5) or 50 wt % (Ex. 6).

Comparative Example (Ref.): Fabrication of QLED

A QLED was fabricated using the same materials as Example 1, except laminating the EML with only the quantum dot without mixing CHB.

Experimental Example 1: Evaluation of Luminous Properties of QLED

Each of the QLED fabricated in Ex. 1 to 6 and Ref. was connected to an external power source and then luminous properties for all the diodes were evaluated using a constant current source (KEITHLEY) and a photometer PR650 at room temperature. In particular, driving voltage (V), current efficiency (cd/A), power efficiency (lm/W), external quantum efficiency (EQE, %), luminance ($cd/m^2$), color coordinates and electroluminescence (EL) intensity at a current density of 10 J ($mA/cm^2$) of the QLEDs were measured. The results thereof are shown in the following Table 1 and FIGS. 5 to 8G.

TABLE 1

| | | Luminous Property of QLED | | | | | |
|---|---|---|---|---|---|---|---|
| Sample | Contents of CHB (wt %) | V | cd/A | lm/W | EQE (%) | $cd/m^2$ | (CIEx, CIEy) |
| Ref. | — | 4.745 | 2.999 | 1.985 | 2.037 | 299.9 | (0.621, 0.346) |
| Ex. 1 | 1 | 4.953 | 3.049 | 1.934 | 3.17 | 304.9 | (0.685, 0.312) |
| Ex. 2 | 5 | 4.200 | 3.645 | 2.726 | 3.44 | 364.5 | (0.661, 0.322) |
| Ex. 3 | 10 | 4.403 | 4.602 | 3.284 | 4.548 | 460.3 | (0.681, 0.314) |
| Ex. 4 | 15 | 4.090 | 3.610 | 2.780 | 3.580 | 361.4 | (0.683, 0.314) |
| Ex. 5 | 20 | 4.457 | 2.050 | 1.445 | 2.01 | 205 | (0.658, 0.319) |
| Ex. 6 | 50 | 4.205 | 1.884 | 1.408 | 1.95 | 188.4 | (0.683, 0.312) |

As indicated in Table 1 and FIGS. 5 to 8G, the QLED in which the EML consists of only the quantum dots in Ref, the QLEDs in which the EML includes the quantum dots mixed with CHB in Ex. 1 to 6 reduced their driving voltages up to 13.8% and improved their current efficiency, power efficiency, EQE and luminance up to 53.5%, 65.4%, 123.3% and 53.5%, respectively.

Examples 7-11 (Ex. 7-11): Fabrication of QLED

A QLED was fabricated using the same materials as Example 3, except using phenyl boronic acid (PB, Ex. 7), 4-methylphnyl boronic acid (MPB, Ex. 8), 3,5-dimethylphenyl boronic acid (DMPB, Ex. 9), 4-fluorophenyl boronic acid (FFB, Ex. 10) or 3,5-difluorophenyl boronic acid (DFFB, Ex. 10) in the EML as the cyclic boronic acid instead of CHB.

Experimental Example 2: Evaluation of Luminous Properties of QLED

Driving voltage (V), current efficiency (cd/A), power efficiency (lm/W), external quantum efficiency (EQE, %), luminance (cd/m$^2$), color coordinates and electroluminescence (EL) intensity at a current density of 10 J (mA/cm$^2$) of the QLEDs in Ex. 3, Ex. 7-11 and Ref. were measured as the Experimental Example 1. The results thereof are shown in the following Table 2 and FIGS. 9A to 12C.

TABLE 2

Luminous Property of QLED

| Sample | Boronic acid (10 wt %) | V | cd/A | lm/W | EQE (%) | cd/m$^2$ | (CIEx, CIEy) |
|---|---|---|---|---|---|---|---|
| Ref. | — | 4.745 | 2.999 | 1.985 | 2.037 | 299.9 | (0.621, 0.346) |
| Ex. 3 | CHB | 4.403 | 4.602 | 3.284 | 4.548 | 460.3 | (0.681, 0.314) |
| Ex. 7 | PB | 4.553 | 3.908 | 2.696 | 3.976 | 390.8 | (0.684, 0.312) |
| Ex. 8 | MPB | 4.523 | 7.334 | 5.094 | 4.940 | 733.5 | (0.662, 0.334) |
| Ex. 9 | DMPB | 4.546 | 4.847 | 3.350 | 4.740 | 484.8 | (0.682, 0.314) |
| Ex. 10 | FFB | 3.941 | 4.466 | 3.560 | 4.502 | 446.6 | (0.679, 0.314) |
| Ex. 11 | DFFB | 3.743 | 4.831 | 4.055 | 4.805 | 483.2 | (0.686, 0.311) |

As indicated in Table 2 and FIGS. 9A to 12C, the QLED in which the EML consists of only the quantum dots in Ref., the QLEDs in which the EML includes the quantum dots mixed with boronic acid in the contents of 10 wt % in Ex. 3, Ex. 7 to 11 reduced their driving voltages up to 21.1% and improved their current efficiency, power efficiency, EQE and luminance up to 144.5%, 156.6%, 142.5% and 144.6%, respectively. In addition, compared the QLED fabricated in Ref., the QLEDs fabricated in Examples showed much increased EL intensities.

It will be apparent to those skilled in the art that various modifications and variations can be made in the present disclosure without departing from the scope of the invention. Thus, it is intended that the present disclosure cover the modifications and variations of the present disclosure provided they come within the scope of the appended claims.

What is claimed is:

1. An inorganic light emitting diode, comprising:
a first electrode;
a second electrode facing the first electrode; and
an emitting material layer disposed between the first and second electrodes,
wherein the emitting material layer comprises an inorganic luminescent particle and a cyclic boronic acid mixed with the inorganic luminescent particle.

2. The inorganic light emitting diode of claim 1, wherein the cyclic boronic acid comprises a $C_4$-$C_{10}$ alicyclic boronic acid.

3. The inorganic light emitting diode of claim 1, wherein the cyclic boronic acid comprises a $C_6$-$C_{20}$ aromatic boronic acid and a $C_3$-$C_{20}$ hetero aromatic boronic acid.

4. The inorganic light emitting diode of claim 1, wherein the cyclic boronic acid is unsubstituted or substituted with a group selected from the group consisting of a halogen, a hydroxyl group, a $C_1$-$C_{10}$ alkyl group, a $C_1$-$C_{10}$ alkyl halide group, $C_1$-$C_{10}$ alkoxy group, a carbonyl group, an amino group, a $C_1$-$C_{10}$ alkyl amino group and combinations thereof.

5. The inorganic light emitting diode of claim 1, wherein the cyclic boronic acid comprises cyclohexyl boronic acid, phenyl boronic acid, 4-methylphenyl boronic acid, 3,5-dimethylphenyl boronic acid, (2,4,5-trimethylpheny) boronic acid, 4-fluorophenyl boronic acid, 4-chlorophenyl boronic acid, 3,5-difluorophenyl boronic acid, (2,5-dichloro-3-fluorophenyl) boronic acid, 4-(boromethyl)phenyl boronic acid, (difluoro-4-hydroxyphenyl) boronic acid, (3-chloro-2-methxyphenyl) boronic acid, (4-chloro-2-(hydroxymetyl) phenyl) boronic acid, 2,5-dimethoxy-4-methyl-phenyl boronic acid, (4-fluoro-5-isopropyl-2-methoxyphenyl) boronic acid, 2-(aminoethyl)phenyl boronic acid, naphthalene-1-boronic acid, fluoranthene-3-boronic acid, pyrene-1-boronic acid, pyridine-3-boronic acid, 2-chloropyridine-3-boronic acid, 2-chloropyridine-4-boronic acid, 2-methylpyridine-5-boronic acid, 3-fluoropyridine-2-boronic acid, 2-bromopyridine-3-boronic acid, 2-isopropoxypyridine-5-boronic acid, pyrimidine-5-boronic acid, quinoline-3-boronic acid, imidazole-2-boronic acid, 1H-imdazole-5-boronic acid, {imidazo[1,2-a]pyridin-6-yl}boronic acid, 1H-pyrazole-4-boronic acid, N-methylindole-5-boronic acid, benzopyrazine-6-boronic acid, (1H-indazol-4-yl) boronic acid, 5-methyl-1H-indazol-4-yl-4-boronic acid, furan-3-boronic acid, benzofuran-4-boronic acid, dibenzofuran-4-boronic acid, 1-benzothiophen-2yl-boronic acid, (1H-indol-5-yl) boronic acid, thianthrene-1-boronic acid, 7-amino-6-iodobenzothiophene-2-boronic acid, dibenzothiophene-4-boronic acid or combinations thereof.

6. The inorganic light emitting diode of claim 1, wherein contents of the cyclic boronic acid in the emitting material layer is from about 1 wt % and about 50 wt %.

7. The inorganic light emitting diode of claim 1, wherein the contents of the cyclic boronic acid in the emitting material layer is from about 5 wt % and about 15 wt %.

8. The inorganic light emitting diode of claim 1, wherein the inorganic luminescent particle includes at least one of a quantum dot (QD) and a quantum rod (QR).

9. The inorganic light emitting diode of claim 1, further comprising at least one of a first charge transfer layer disposed between the first electrode and the emitting material layer, and a second charge transfer layer disposed between the emitting material layer and the second electrode.

10. The inorganic light emitting diode of claim 9, further comprising at least one of an electron blocking layer disposed between the first charge transfer layer and the emitting material layer and a hole blocking layer disposed between the emitting material layer and the second charge transfer layer.

11. An inorganic light emitting device, comprising:
a substrate; and
the inorganic light emitting diode of claim 1 over the substrate.

12. The inorganic light emitting device of claim 11, wherein the cyclic boronic acid comprises a $C_4$-$C_{10}$ alicyclic boronic acid.

13. The inorganic light emitting device of claim 11, wherein the cyclic boronic acid comprises a $C_6$-$C_{20}$ aromatic boronic acid and a $C_3$-$C_{20}$ hetero aromatic boronic acid.

14. The inorganic light emitting device of claim 11, wherein the cyclic boronic acid is unsubstituted or substituted with a group selected from halogen, a hydroxyl group, a $C_1$-$C_{10}$ alkyl group, a $C_1$-$C_{10}$ alkyl halide group, $C_1$-$C_{10}$ alkoxy group, a carbonyl group, an amino group, a $C_1$-$C_{10}$ alkyl amino group and combination thereof.

15. The inorganic light emitting device of claim 11, wherein the cyclic boronic acid comprises cyclohexyl boronic acid, phenyl boronic acid, 4-methylphenyl boronic acid, 3,5-dimethylphenyl boronic acid, (2,4,5-trimethylpheny) boronic acid, 4-fluorophenyl boronic acid, 4-chlorophenyl boronic acid, 3,5-difluorophenyl boronic acid, (2,5-dichloro-3-fluorophenyl) boronic acid, 4-(boromethyl) phenyl boronic acid, (difluoro-4-hydroxyphenyl) boronic acid, (3-chloro-2-methxyphenyl) boronic acid, (4-chloro-2-(hydroxymetyl)phenyl) boronic acid, 2,5-dimethoxy-4-methyl-phenyl boronic acid, (4-fluoro-5-isopropyl-2- methoxyphenyl) boronic acid, 2-(aminoethyl)phenyl) boronic acid, naphthalene-1-boronic acid, fluoranthene-3-boronic acid, pyrene-1-boronic acid, pyridine-3-boronic acid, 2-chloropyridine-3-boronic acid, 2-chloropyridine-4-boronic acid, 2-methylpyridine-5-boronic acid, 3-fluoropyridine-2-boronic acid, 2-bromopyridine-3-boronic acid, 2-isopropoxypyridine-5-boronic acid, pyrimidine-5-boronic acid, quinoline-3-boronic acid, imidazole-2-boronic acid, 1H-imdazole-5-boronic acid, {imidazo[1,2-a]pyridin-6-yl}boronic acid, 1H-pyrazole-4-boronic acid, N-methylindole-5-boronic acid, benzopyrazine-6-boronic acid, (1H-indazol-4-yl) boronic acid, 5-methyl-1H-indazol-4-yl-4-boronic acid, furan-3-boronic acid, benzofuran-4-boronic acid, dibenzofuran-4-boronic acid, 1-benzothiophen-2yl-boronic acid, (1H-indol-5-yl) boronic acid, thianthrene-1-boronic acid, 7-amino-6-iodobenzothiophene-2-boronic acid, dibenzothiophene-4-boronic acid and combination thereof.

16. The inorganic light emitting device of claim 11, wherein contents of the cyclic boronic acid in the emitting material layer is from about 1 wt % and about 50 wt %.

17. The inorganic light emitting device of claim 11, wherein the contents of the cyclic boronic acid in the emitting material layer is from about 5 wt % and about 15 wt %.

18. The inorganic light emitting device of claim 11, wherein the inorganic luminescent particle includes at least one of a quantum dot (QD) and a quantum rod (QR).

19. The inorganic light emitting device of claim 1, wherein the inorganic light emitting diode further comprises at least one of a first charge transfer layer disposed between the first electrode and the emitting material layer, and a second charge transfer layer disposed between the emitting material layer and the second electrode.

20. The inorganic light emitting device of claim 19, wherein the inorganic light emitting diode further comprises at least one of an electron blocking layer disposed between the first charge transfer layer and the emitting material layer and a hole blocking layer disposed between the emitting material layer and the second charge transfer layer.

* * * * *